US010978338B1

(12) United States Patent
Shih

(10) Patent No.: US 10,978,338 B1
(45) Date of Patent: Apr. 13, 2021

(54) SEMICONDUCTOR DEVICE AND MANUFACTURE METHOD THEREOF

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 34 days.

(21) Appl. No.: 16/681,851

(22) Filed: Nov. 13, 2019

(51) Int. Cl.
*H01L 21/768* (2006.01)
*H01L 23/528* (2006.01)

(52) U.S. Cl.
CPC .. *H01L 21/76849* (2013.01); *H01L 21/76834* (2013.01); *H01L 23/5283* (2013.01)

(58) Field of Classification Search
CPC ......... H01L 21/76849; H01L 21/76834; H01L 23/5283
See application file for complete search history.

(56) References Cited

U.S. PATENT DOCUMENTS 10,892,403 B2 * 1/2021 Marchack ............. H01L 27/222
2019/0088695 A1 * 3/2019 Chhun .............. H01L 27/14634

\* cited by examiner

*Primary Examiner* — Karen Kusumakar
(74) *Attorney, Agent, or Firm* — CKC & Partners Co., LLC

(57) ABSTRACT

A semiconductor device includes substrate, arrays, conductive structures, and liner spacer layer is provided. The substrate has array region and peripheral region. The arrays are disposed on the array region, and have conductive pillars. The conductive structures are located on the peripheral region, and have at least one connecting sidewall. The liner spacer layer covers the conductive pillars and the conductive structures. Sidewalls of the conductive pillars of the arrays facing a first direction and the connecting sidewall of the conductive structure are free from the liner spacer layer. The conductive pillars are arranged along a second direction in the array, and the second direction is different from the first direction. The liner spacer layer covering the arrays and the conductive structures are extended from the substrate. A manufacturing method of the semiconductor device is also provided.

10 Claims, 29 Drawing Sheets

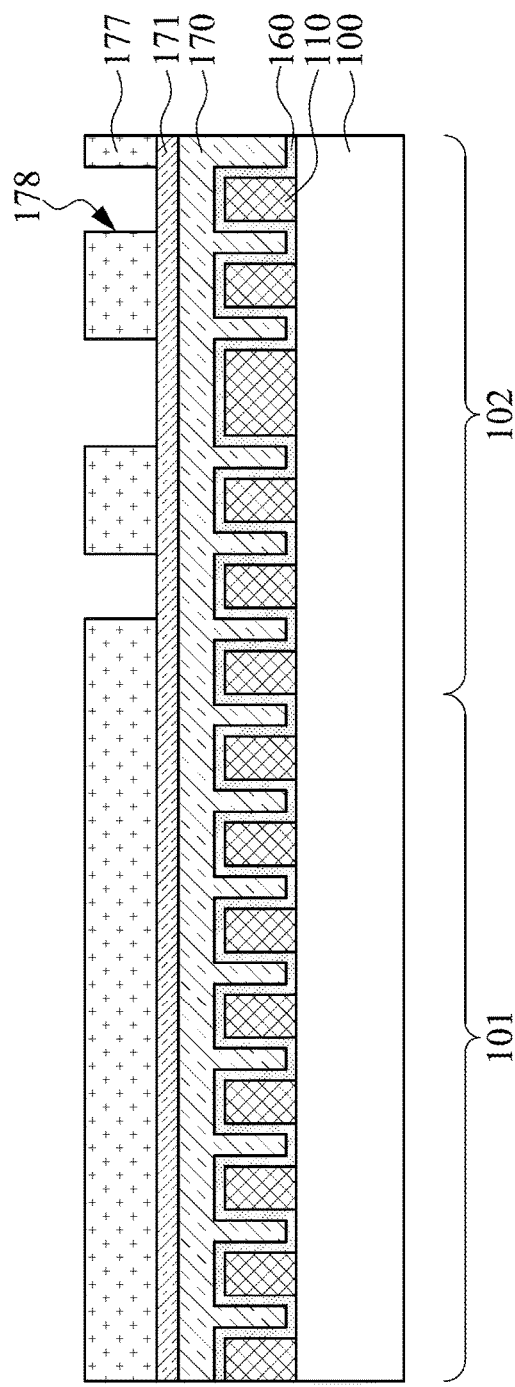
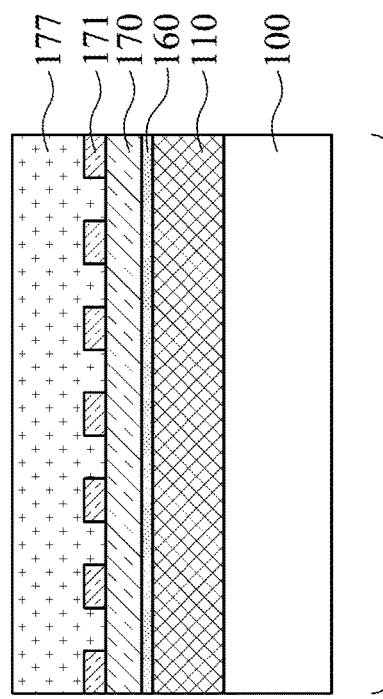
Fig. 13B
Fig. 13C

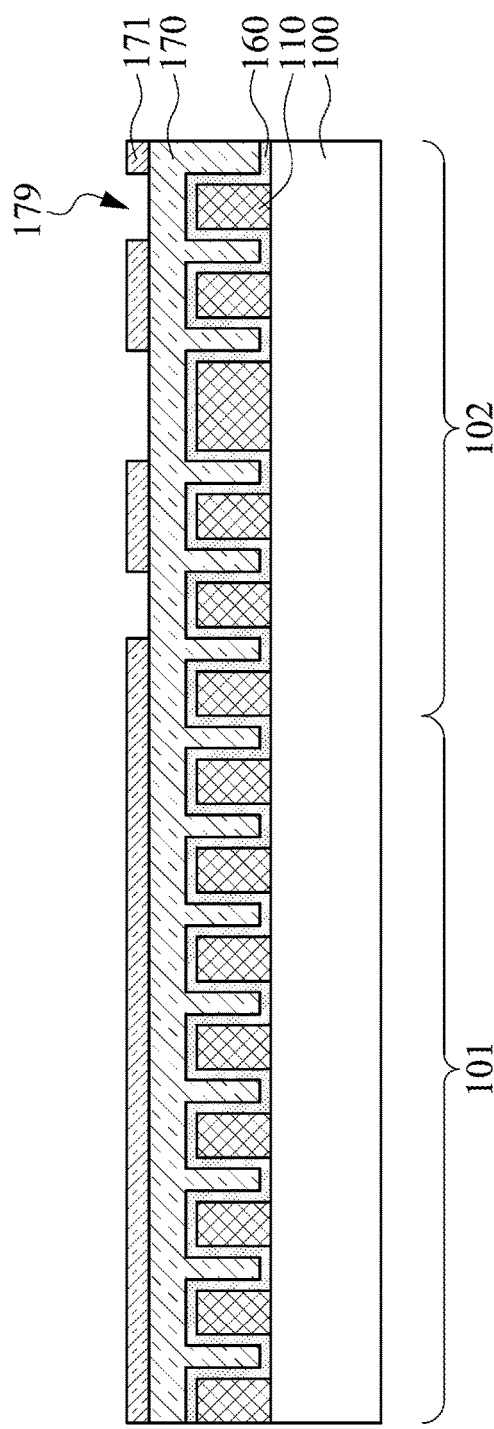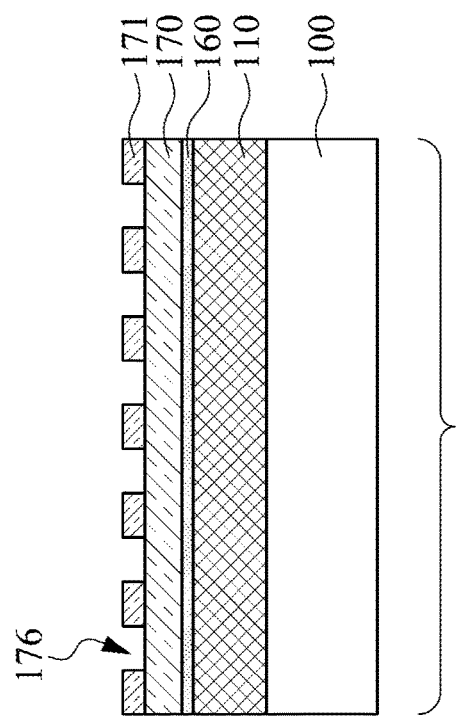

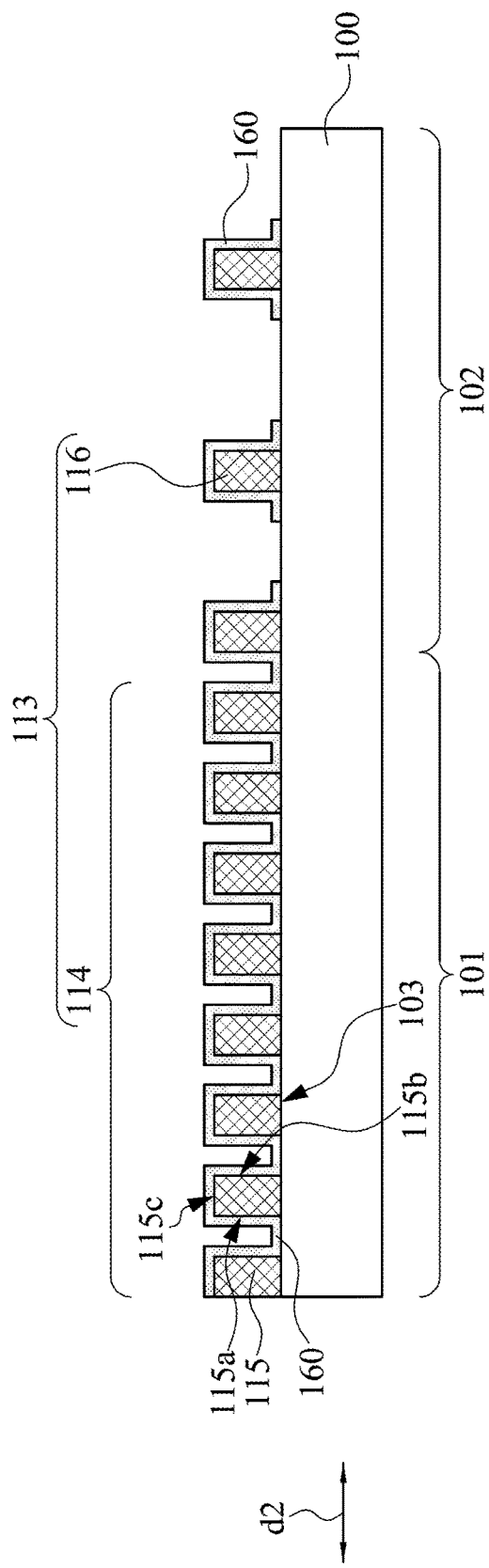
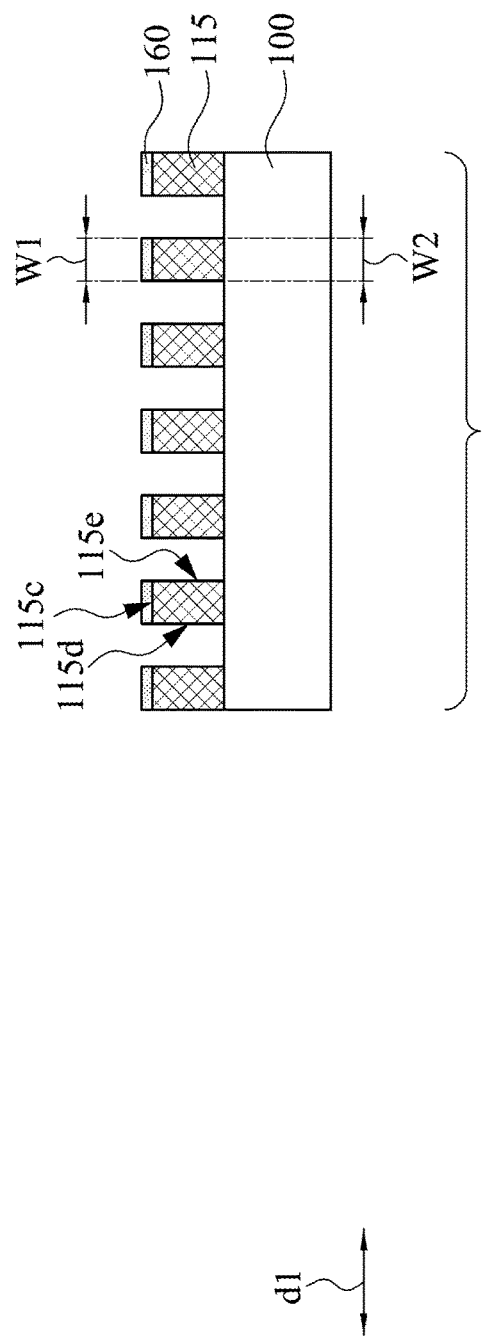
Fig. 15B
Fig. 15C

SEMICONDUCTOR DEVICE AND MANUFACTURE METHOD THEREOF

BACKGROUND

Field of Disclosure

The present disclosure relates to a semiconductor device and a manufacture method thereof. More particularly, the present disclosure relates to a semiconductor device having patterned array region and peripheral region and the manufacturing method thereof.

Description of Related Art

The semiconductor integrated circuit (IC) industry has experienced rapid growth. Technological progress in IC manufacture has produces several generations of ICs, and each generation fabricates smaller and more complex circuits than the previous generation. The critical dimension of patterns can be reduced by increasing the resolution of lithographic processes, but this approach usually costs much. To improve the issue, the so-called double patterning techniques have been proposed. However, conventional techniques have not been entirely satisfactory in all respects, and there is still a need to develop a new approach which is more cost-effective.

SUMMARY

The present disclosure relates in general to a semiconductor device and a manufacturing method thereof.

According to an embodiment of the present disclosure, a semiconductor device includes a substrate, arrays, conductive structures, and a liner spacer layer. The substrate has an array region and a peripheral region. The arrays are disposed on the array region, and each of the arrays has conductive pillars. The conductive structures are located on the peripheral region, and each of the conductive structures has at least one connecting sidewall. The liner spacer layer covers top surfaces of the conductive pillars of the arrays and top surfaces of the conductive structures. First sidewalls of the conductive pillars of the arrays facing a first direction and the connecting sidewall of the conductive structure are free from the liner spacer layer. The conductive pillars are arranged along a second direction in each of the arrays, and the second direction is different from the first direction, and the liner spacer layer covering the arrays and the conductive structures are extended from the substrate.

In an embodiment of the present disclosure, material of the liner spacer layer includes silicon oxide or silicon nitride.

In an embodiment of the present disclosure, each of the conductive pillars includes second sidewalls facing along the second direction, and the top surface and the second sidewall facing along the second direction of the conductive pillars are covered with the liner spacer layer.

In an embodiment of the present disclosure, the liner spacer layer on one of the conductive pillars is connected to the liner spacer layer on another conductive pillar in every array.

In an embodiment of the present disclosure, the liner spacer layer includes a plurality of openings in the peripheral region, and the rest of the peripheral region is covered with the liner spacer layer, and locations of the connecting sidewalls of the conductive structure are corresponded to locations of the openings of the liner spacer layer.

In an embodiment of the present disclosure, the liner spacer layer includes a plurality of strips, and the arrays are respectively covered by the strips.

In an embodiment of the present disclosure, width of each of the strips and width of each of the conductive pillars on the first direction are substantially the same.

According to an embodiment of the present disclosure, method for manufacturing a semiconductor device of an embodiment of the present disclosure includes: patterning a target metal layer on an array region and a peripheral region of a substrate, wherein the patterned target metal layer includes a plurality of conductive strips located at the array region and a plurality of peripheral structures located at the peripheral region; disposing a liner spacer layer on the conductive strips and the peripheral structures; disposing a lower hard mask layer on the linear spacer layer; etching the lower hard mask layer on the array region; etching the lower hard mask layer on the peripheral region; and etching the conductive strips and the peripheral structures into a plurality of conductive pillars and a plurality of conductive structures respectively by using the lower hard mask layer, wherein the conductive strips extend along a first direction, and the etched lower hard mask layer defines a plurality of trenches extending along a second direction in the array region, which is different from the first direction, and the etched lower hard mask layer has a plurality of holes on the peripheral region, and etching of the target metal layer cuts the peripheral structures into a plurality of conductive structures.

In an embodiment of the present disclosure, the liner spacer layer is disposed on the conductive strips and the peripheral structures through atomic layer deposition, and the liner spacer layer extends from the substrate to tops of the conductive strips and the peripheral structures.

In an embodiment of the present disclosure, the method further includes: disposing a lower organic hard mask layer on the liner spacer layer after the liner spacer layer is disposed on the conductive structures and the peripheral structures, wherein the lower organic hard mask layer fills a plurality of gap between the liner spacer layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIGS. 2A to 6A are top views illustrating various stages of a patterning method of the target metal layer of the embodiment of the present disclosure;

FIGS. 2B to 6B are sectional views corresponding to cutting plane line B of FIGS. 2A to 6A, respectively;

FIGS. 8A to 15A are top views illustrating various stages of a patterning method of a lower hard mask layer and the etching of the target metal layer;

FIGS. 8B to 15B are sectional view corresponding to cutting plane line B of FIGS. 8A to 15A; respectively, and FIGS. 8C to 15C are sectional view corresponding to cutting plane line C of FIGS. 8A to 15A, respectively.

DETAILED DESCRIPTION

Figure 1:
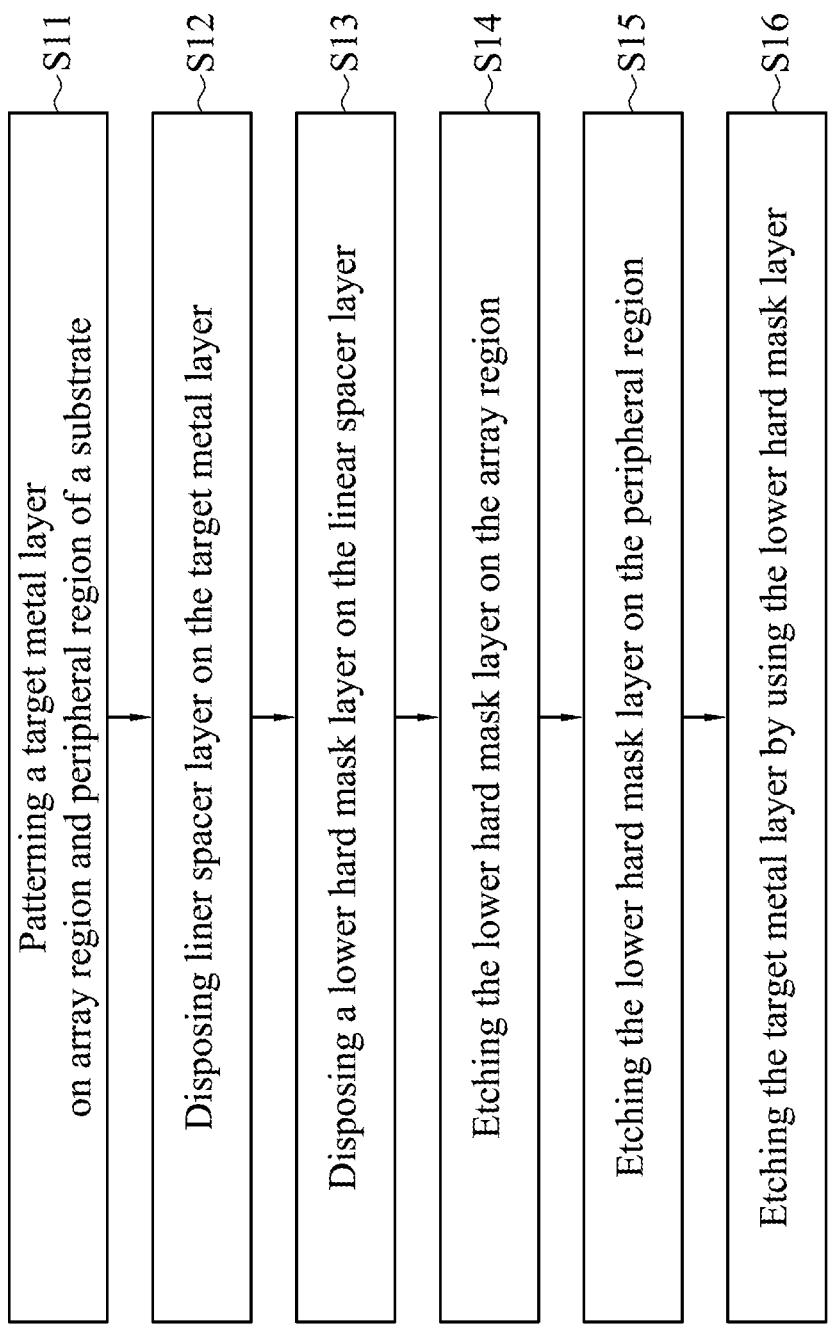
FIG. 1 is a flow chart of method of manufacturing a semiconductor device in accordance with an embodiment of the present disclosure.

The present disclosure relates to an improvement in semiconductor device and the manufacturing method thereof. The following description is presented to enable one of ordinary skill in the art to make and use the disclosure as provided in the context of a particular application and its requirements. Various modifications to the preferred embodiment will be apparent to those with skill in the art, and the general principles defined herein may be applied to other embodiments. Therefore, the present disclosure is not intended to be limited to the particular embodiments shown and described, but is to be accorded the widest scope consistent with the principles and novel features herein disclosed.

In the figures, the thickness of layers, films, panels, regions, etc., are exaggerated for clarity. Throughout the specification, the same reference numerals denote the same component. It will be understood that when a component such as a layer, a film, a region or a substrate is referred to as "on" or "connected to" another component, intermediate components can also be present. In contrast, when a component is referred to as "directly on" or "directly connected to" another component, no intermediate component can be present. As used herein, "connected" may refer to both physical and/or electrical connections. Furthermore, "electrical connection" or "coupled" may be the presence of other components between two elements.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Reference will now be made in detail to the present embodiments of the disclosure, examples of which are illustrated in the accompanying drawings. Wherever possible, the same reference numbers are used in the drawings and the description to refer to the same or like parts.

The terms "forming," "form," "deposit," or "dispose" are used herein to describe the act of applying a layer of material to another layer. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a layer. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD).

FIG. 1 is a flow chart of method of manufacturing a semiconductor device in accordance with an embodiment of the present disclosure. Referring to FIG. 1, method of manufacturing a semiconductor device of the embodiment includes the following steps: patterning a target metal layer on an array region and a peripheral region of a substrate (S11), wherein the patterned target metal layer has conductive strips and peripheral structures; disposing liner spacer layer on the target metal layer (S12); disposing lower hard mask layer on the liner spacer layer (S13); etching the lower hard mask layer on the array region (S14); etching the lower hard mask layer on the peripheral region (S15); and etching the target metal layer by using the etched lower hard mask layer (S16). The liner spacer layer is disposed on the conductive strips and the peripheral structures, and the conductive strips are etched into a plurality of array using the lower hard mask layer, and the peripheral structures are etched into a plurality of conductive structures using the lower hard mask layer.

In the embodiment, the conductive strips of the patterned target metal layer are on the array region, extending along a first direction, and the etched hard mask layer on the array region defines a plurality of trenches extending along a second direction, which is different from the first direction. The etching of the target metal layer etches the conductive strips into a plurality of arrays, and each of the arrays has a plurality of conductive pillars. In the embodiment, the semiconductor device includes a plurality of array in the array region.

Peripheral structures of the patterned target metal layer are on the peripheral region, and the etched hard mask layer on the peripheral region has a plurality of hole. Parts of the peripheral structures extend along the first direction, and other parts of the peripheral structures extend along second directions, and the etching process of the target metal layer cuts the peripheral structures into a plurality of conductive structures. In some embodiments of the present disclosure, the conductive structures can be peripheral circuits of the arrays, and the peripheral circuits may include read-write circuits, sense amp circuits, and power management circuits.

In the embodiment, the method disposes the liner spacer layer on the target metal layer, and the liner spacer layer covers the top surfaces and side walls of the conductive strips and the peripheral structures, and the liner spacer layer also covers parts of the substrate which are located between the conductive strips and the peripheral structures. The liner spacer layer is able to protect and provide structural support to the patterned target metal layer during the subsequent processes. The following will illustrate the method of manufacturing the semiconductor device of the embodiment with details. However, the present disclosure is not limited to the following description of the embodiment.

FIGS. 2A to 6A are top views illustrating various stages of a patterning method of the target metal layer of the embodiment of the present disclosure, and FIGS. 2B to 6B are sectional views corresponding to cutting plane line B of FIGS. 2A to 6A, respectively.

Figure 2A:
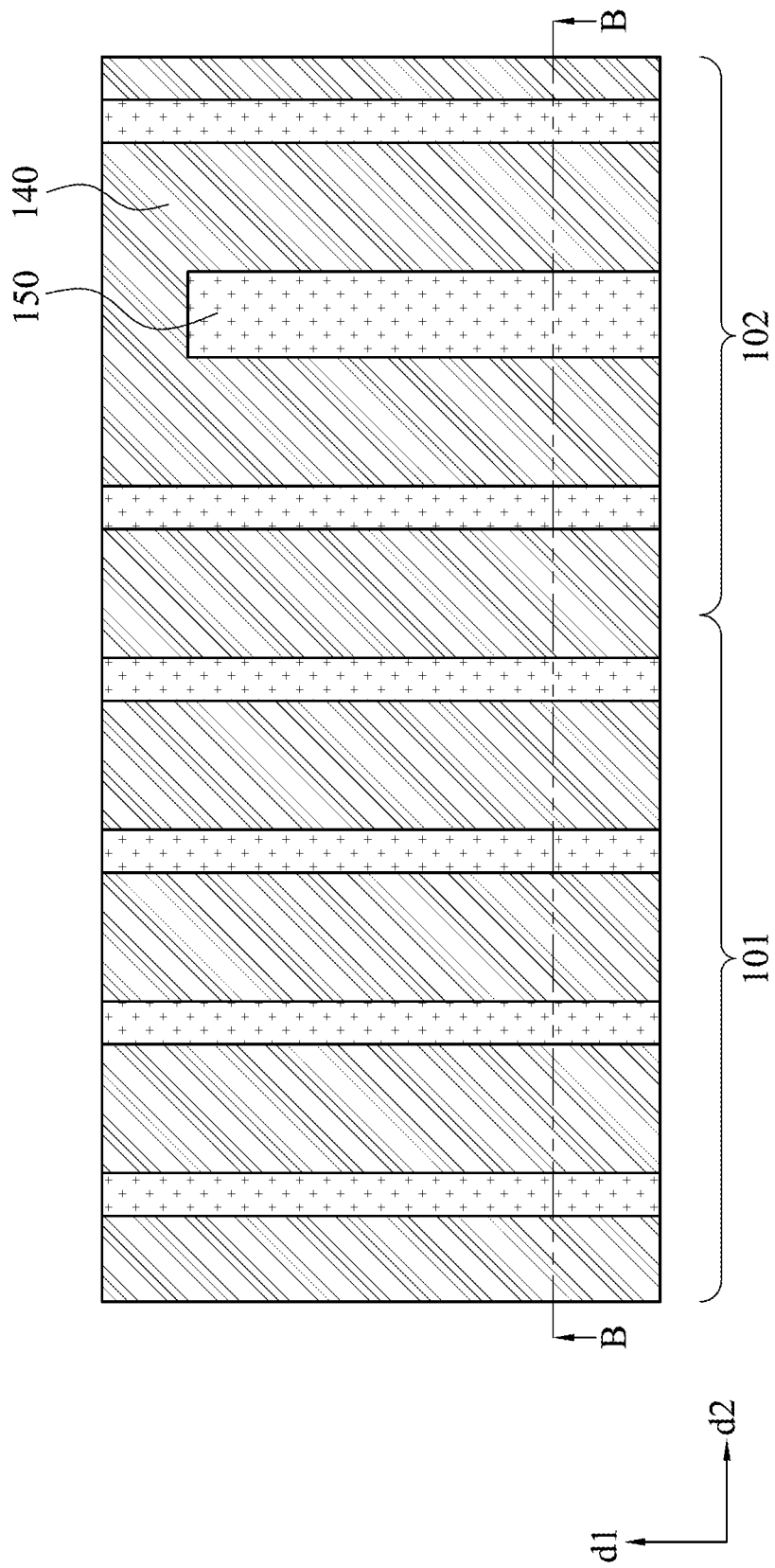
Figure 2B:
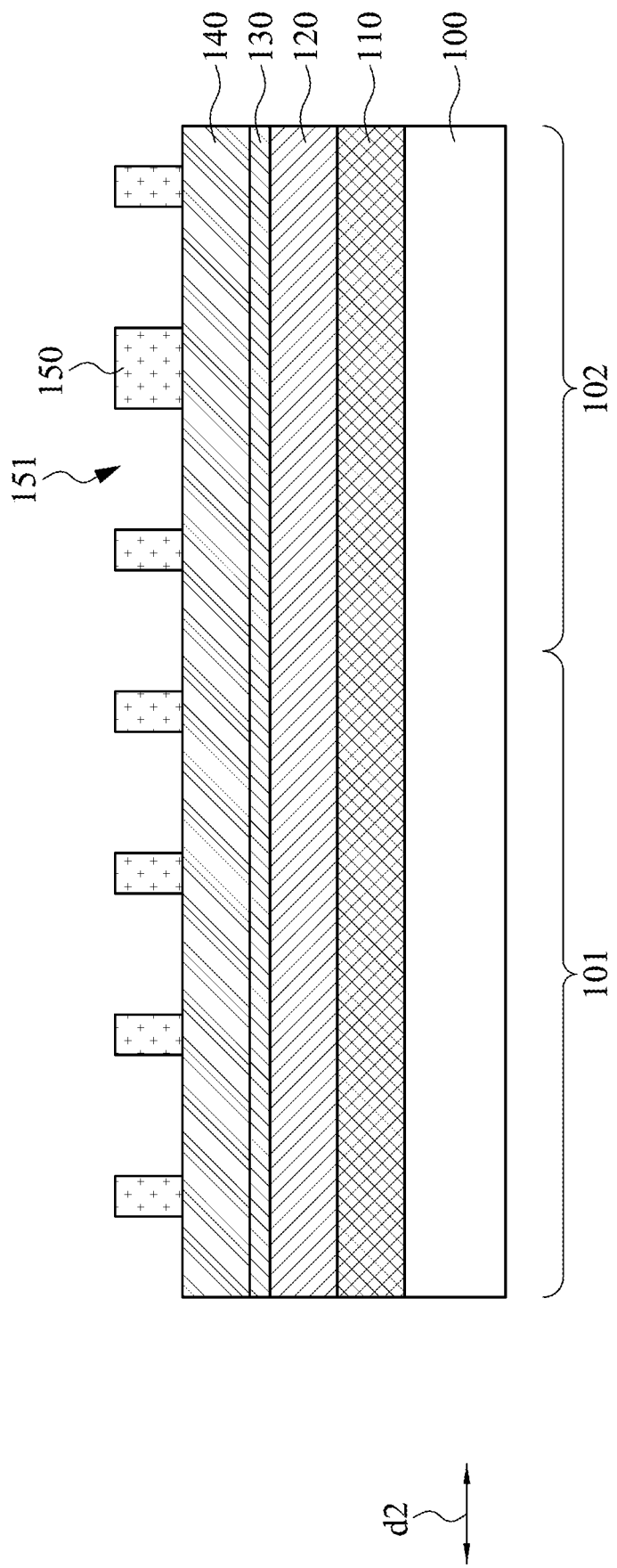

To be specific, referring to FIGS. 2A and 2B, in an embodiment of the present disclosure, the manufacturing method provides a substrate 100, a target metal layer 110, a lower hard mask layer 120, an upper hard mask layer 130, an organic hard mask layer 140, and a photoresist layer 150. The target metal layer 110 is located between the substrate 100 and the lower hard mask layer 120, and the upper hard mask layer 130 and the organic hard mask layer 140 are disposed on the lower hard mask layer 120 sequentially. The photoresist layer 150 located on the organic hard mask layer 140 has a plurality of openings 151 exposing the organic hard mask layer 140, defining etching regions of the organic hard mask layer 140.

In the embodiment, the substrate 100 has an array region 101 and a peripheral region 102. For example, the openings 151 of the photoresist layer 150 define a plurality of strip areas in the array region 101 and a plurality of intersected area in the peripheral region 102.

Thicknesses of the target metal layer 110, the lower hard mask layer 120, the upper hard mask layer 130, the organic hard mask layer 140 and the photoresist layer 150 may be appropriately varied by those skilled in the art.

Material of the upper hard mask layer 130 in the embodiment may include silicon oxynitride (SiON), and material of the lower hard mask layer 120 may include carbon. In some embodiments of the present disclosure, material of the upper hard mask layer 130 may include silicon nitride (SiN) or silicon monoxide (SiO).

Referring to FIG. 2A, material of the target metal layer 110 may include tungsten (W). In some embodiments of the present disclosure, material of the target metal layer 110 may include titanium nitride (TiN).

Figure 3A:
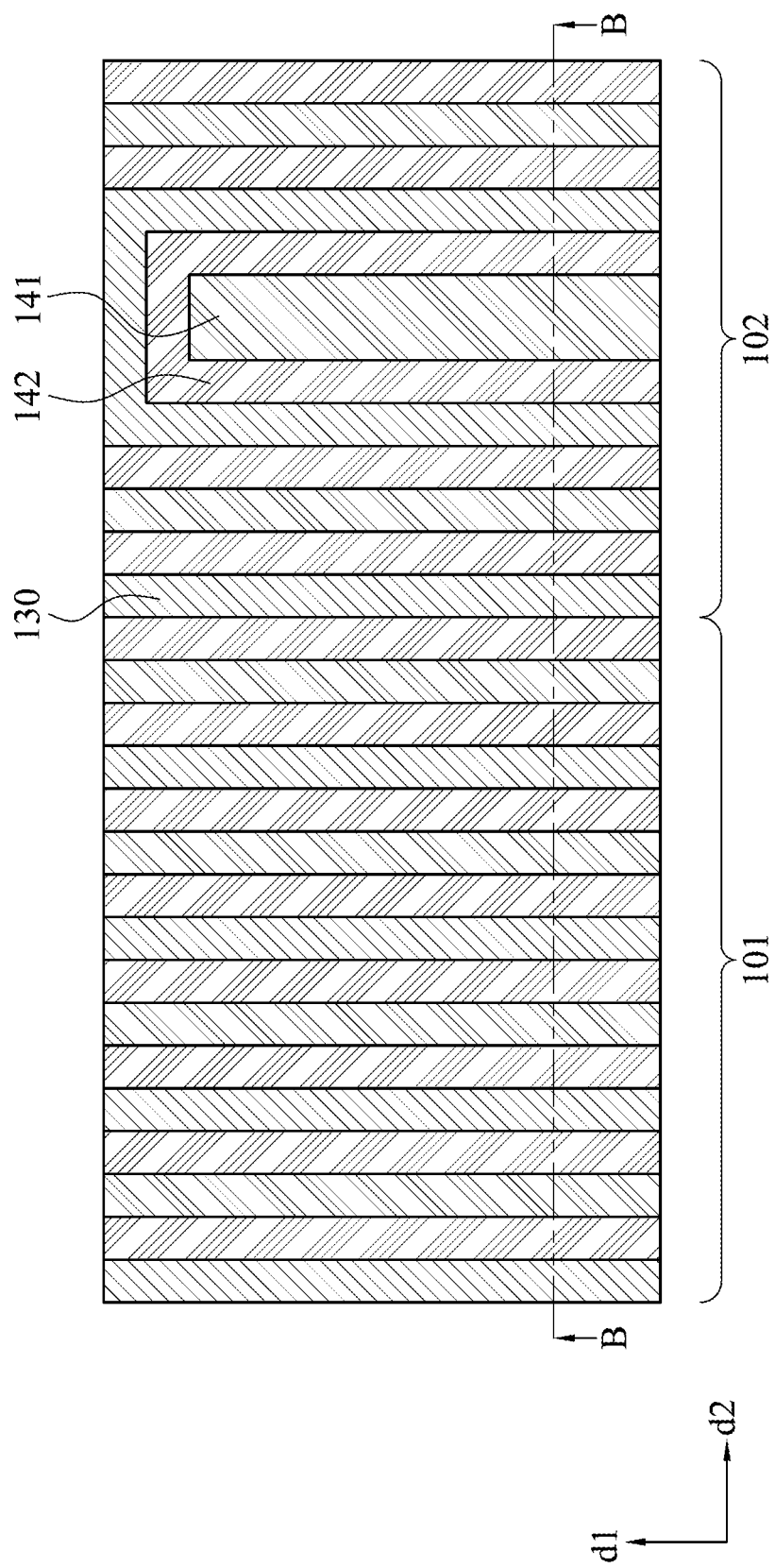
Figure 3B:
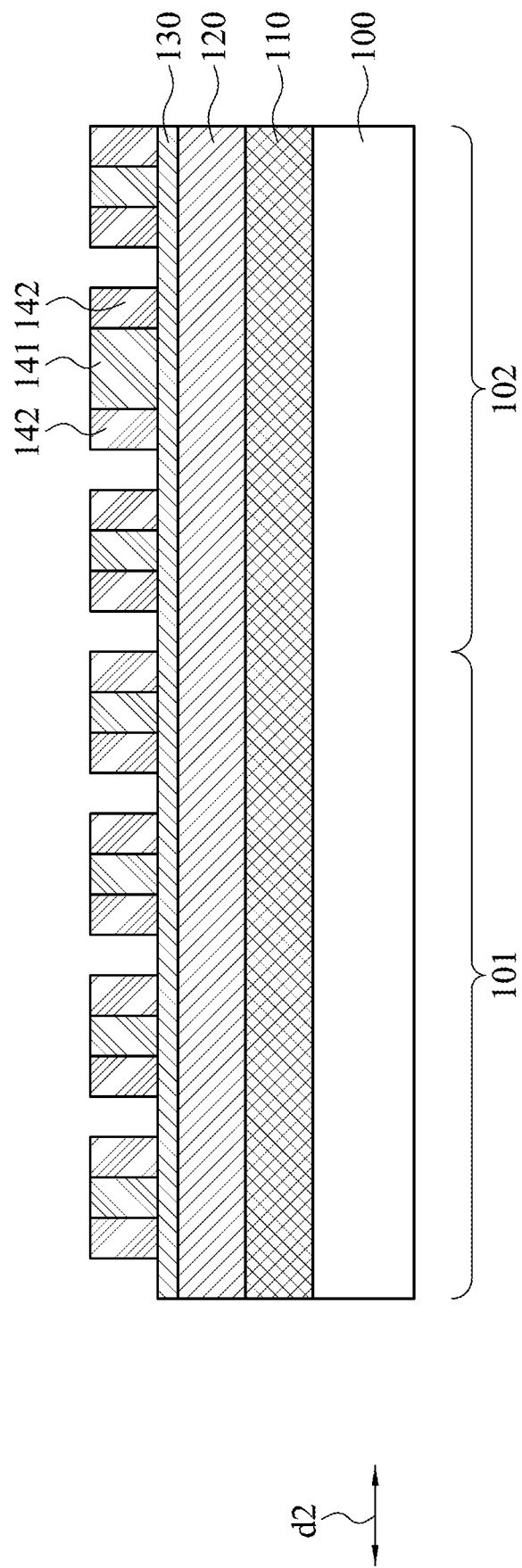

Referring to FIGS. 3A and 3B, the method of the embodiment etches part the organic hard mask layer 140 being exposed by the photoresist layer 150, and turns the other part of the organic hard mask layer 140 covered by the photoresist layer 150 into a plurality of organic cores 141. The method of the embodiment forms a plurality of first spacers 142 located at sidewalls of the organic cores 141 on both the array region 101 and the peripheral region 102.

Formation of the first spacers 142 may include forming a first spacer layer (not shown) on the organic cores 141 and the upper hard mask layer 130 by Atomic Layer Deposition (ALD), and removing part of the first spacer layer located on the top of the organic cores 141 and the upper hard mask layer 130. The removing of the first spacer layer can be performed by etching horizontal portion of the first spacer layer.

In the embodiment, the organic cores 141 in the array region 101 has side walls facing along the second direction d2, and the first spacers 142 are disposed on the side walls, and, therefore, the first spacers 142 in the array region 101 are extending along the first direction d1.

The organic cores 141 in the peripheral region 102 has side walls facing along the first direction d1 and side walls facing along the second direction d2, and the first spacers 142 in the peripheral region 102 have geometry structure extending along the first direction d1 which may be interconnected by other geometry structure extending along the second direction d2.

For example, in the embodiment, material of the first spacers 142 may include SiN, SiO, etc.

Figure 4A:
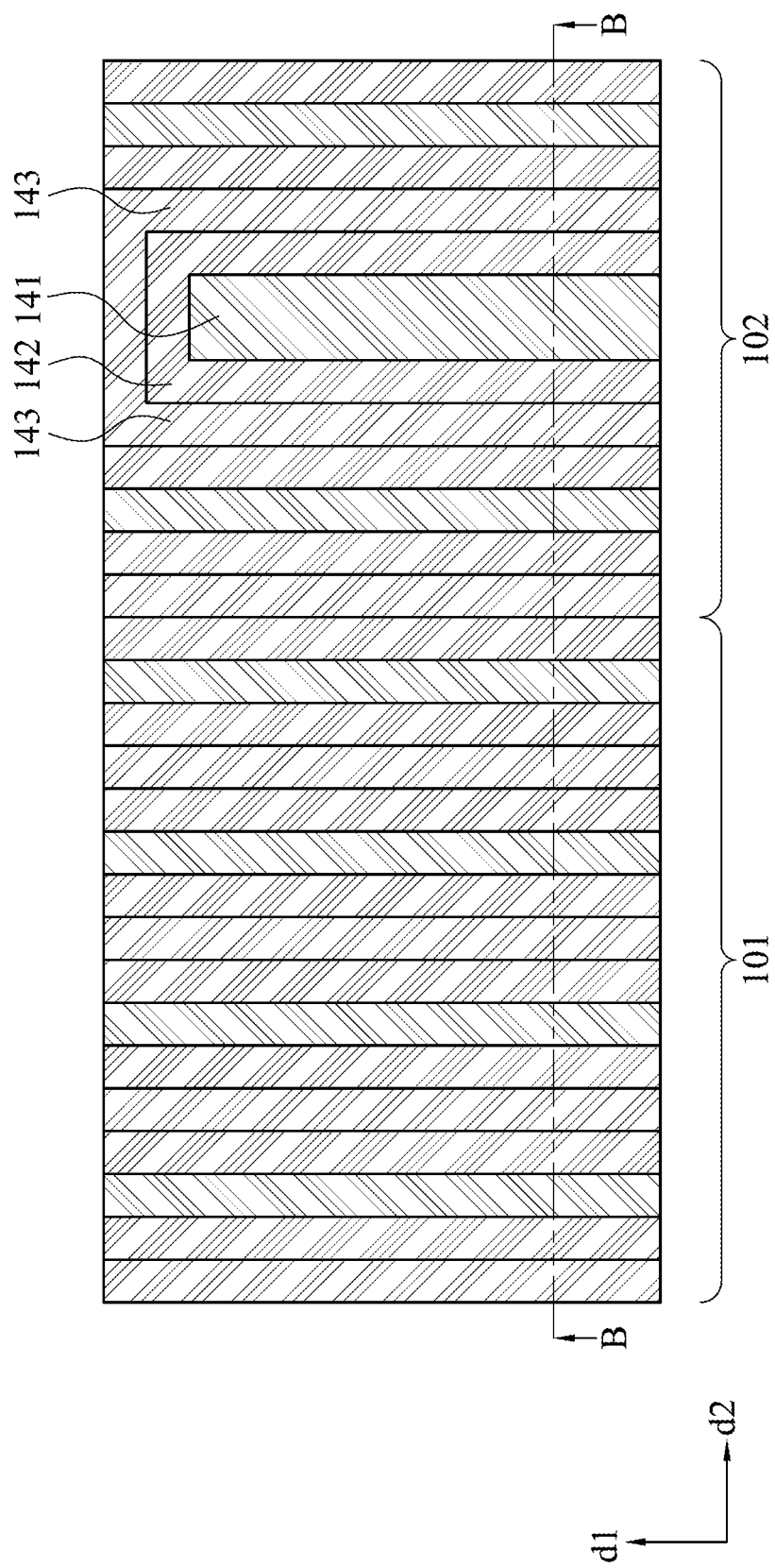
Figure 4B:
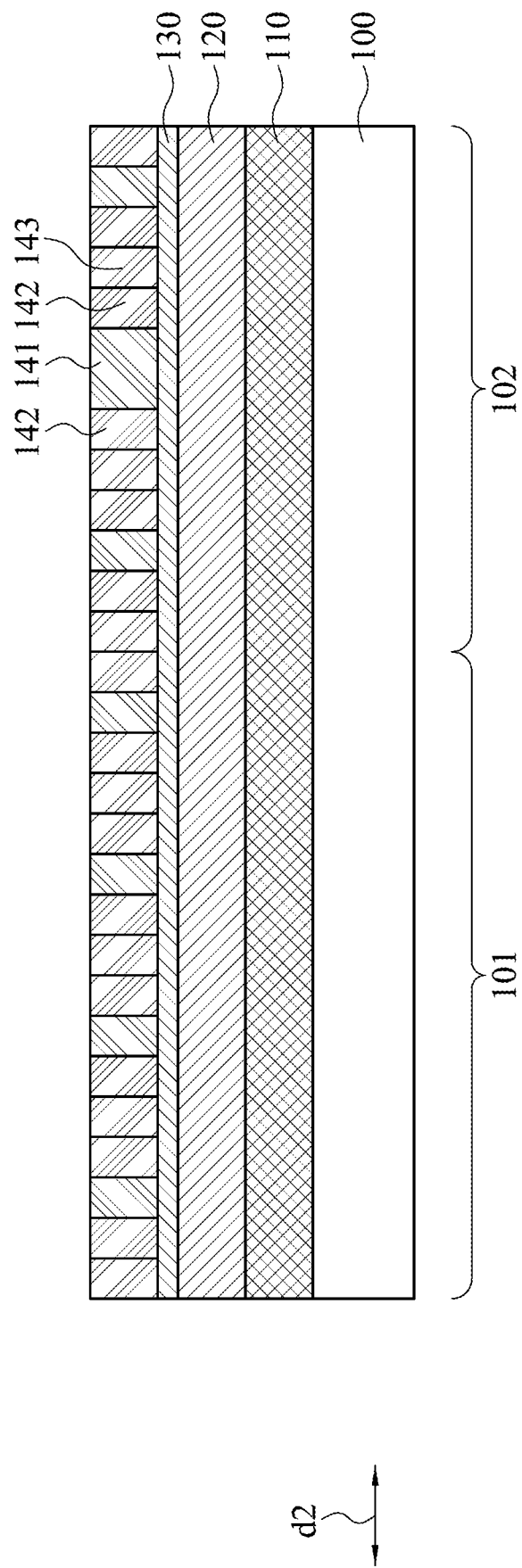

Referring to FIGS. 4A and 4B, the method of the embodiment coats an organic layer 143, and the organic layer 143 fills the areas between the first spacers 142. Material of the organic layer 143 and the organic cores 141 are the same, which includes organic material.

The method of the embodiment may dispose the organic layer 143 covering the top surfaces of the organic cores 141, the first spacers 142, and the upper hard mask layer 130, and removes part of the organic layer 143 located above the level of the top surfaces of the organic cores 141 and the first spacers 142 using chemical-mechanical planarization (CMP). And, therefore, the organic layer 143 and the organic cores 141 of the embodiment provide a flat smooth surface, and a proper surface level for further etching process is formed.

Figure 5A:
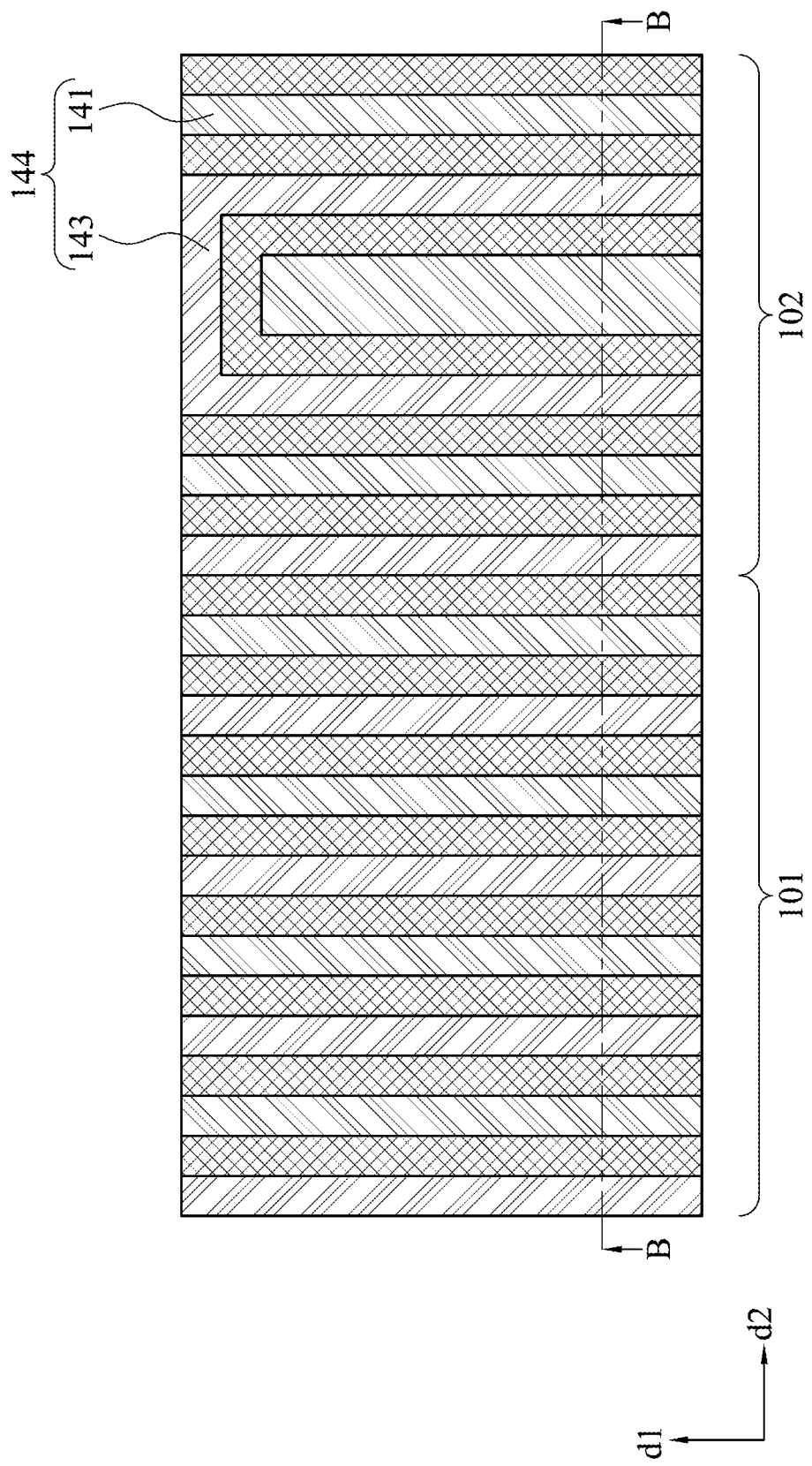
Figure 5B:
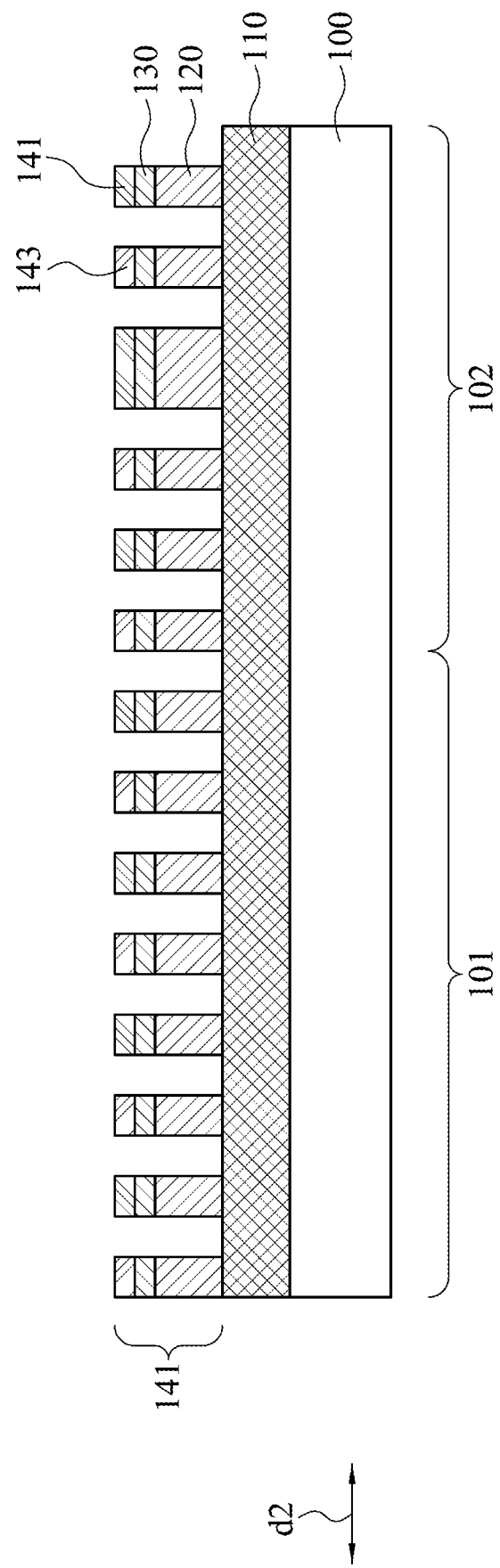

Referring to FIGS. 5A and 5B, the method of the embodiment etches the first spacers 142, and part of the upper hard mask layer 130 and the lower hard mask layer 140 covered by the first spacers 142 are removed. The other part of the upper hard mask layer 130, which is covered by the organic layer 143 or the organic cores 141, forms a plurality of hard mask structures 144 on the target metal layer 110.

Each of the hard mask structures 144 includes part of the organic core 141 or the organic layer 143 at top, and the hard mask structure 144 has upper hard mask layer 130 and lower hard mask layer 120 sequentially located below the organic core 141 or the organic layer 143. The hard mask structures 144 have patterns extending along a first direction d1 on the array region 101, and the hard mask structures 144 have patterns extending along both the first direction d1 and second direction d2 on the peripheral region 102.

Figure 6A:
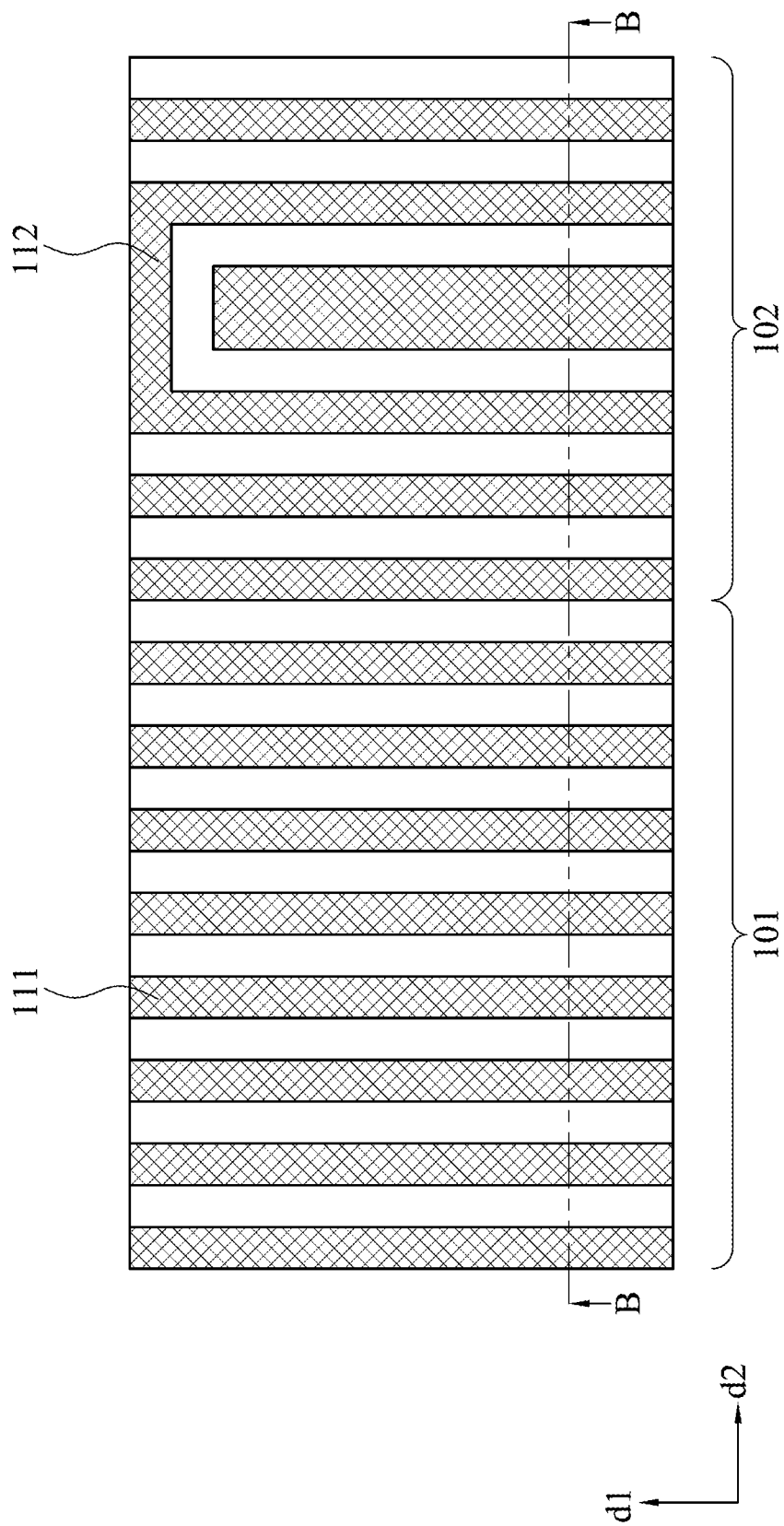
Figure 6B:
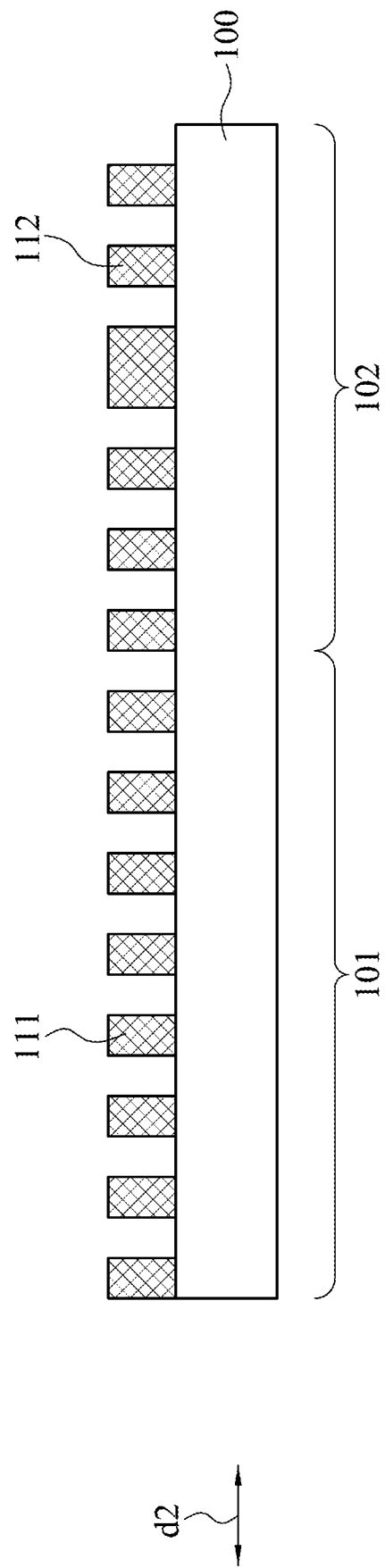

Referring to FIGS. 6A and 6B, the method of the embodiment etches the target metal layer 110 using the pattern of the hard mask structures 144 as masks, and, therefore, forms a plurality of conductive strips 111 and a plurality of peripheral structures 112. The conductive strips 111 are located on the array region 101, extending along the first direction d1, and the peripheral structures 112 are located on the peripheral region 102. The peripheral structures 112 in the peripheral region 102 have geometrical structures extending along the first direction d1 and geometrical structures extending along the second direction d2, which interconnects the geometrical structures extending along the first direction.

In some embodiments, the etching process of the target metal layer 110 may be performed in a comprehensive manner so that the hard mask structures 144 are completely etched away, but the target metal layer 110 is partially etched.

Figure 7A:
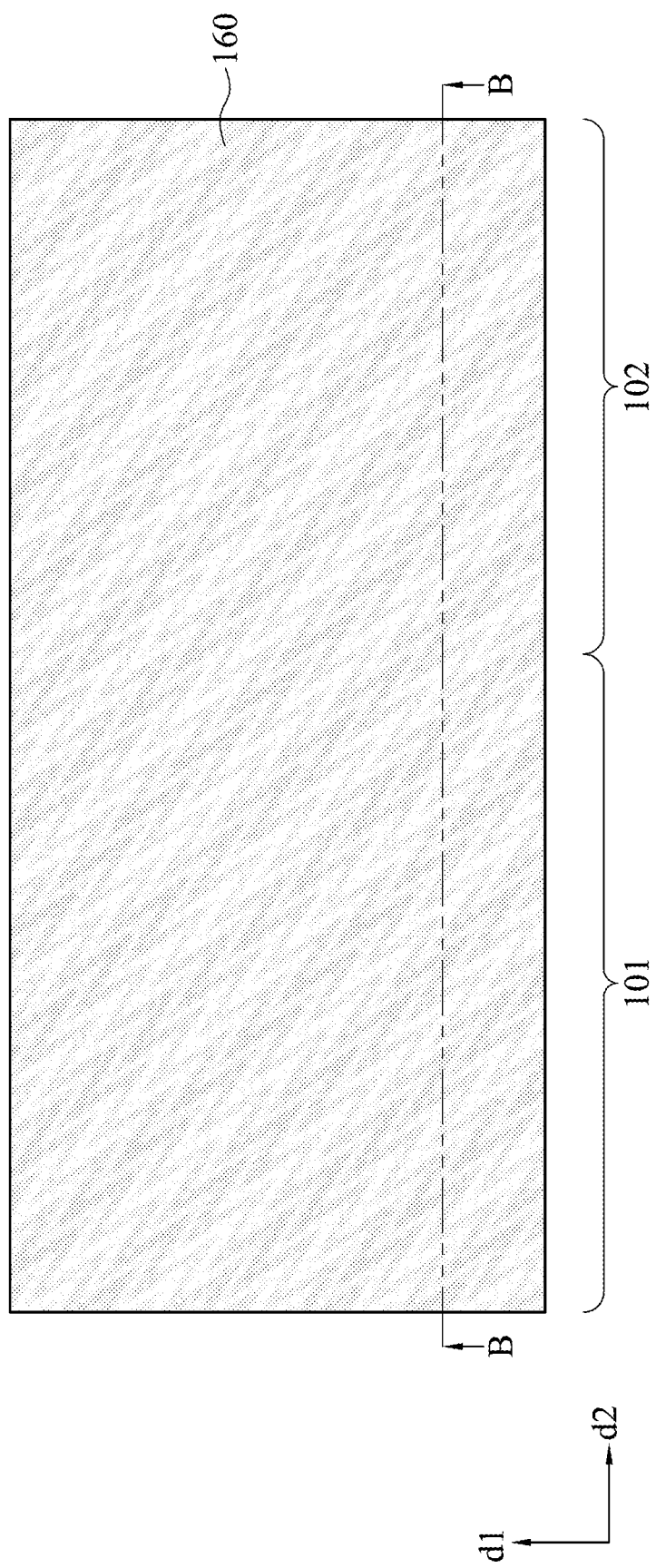
FIG. 7A is a top view illustrating stage of disposing a liner spacer layer of the embodiment of the present disclosure.
Figure 7B:
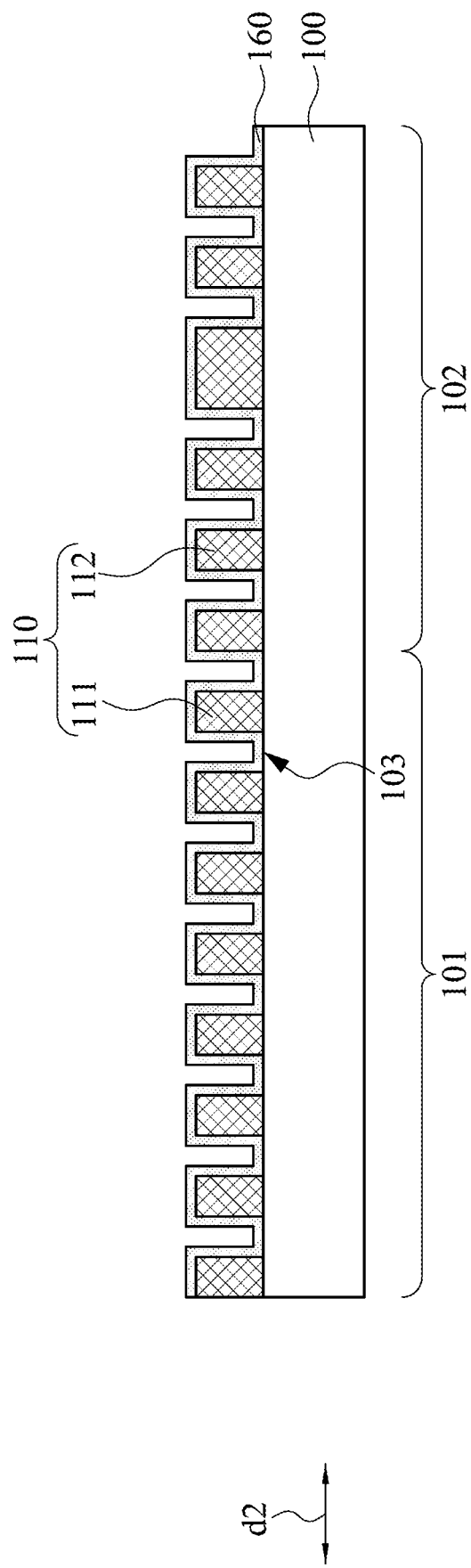
FIG. 7B is a sectional view corresponding to cutting plane line B of FIG. 7A.

FIG. 7A is a top view illustrating stage of disposing a liner spacer layer of the embodiment of the present disclosure, and FIG. 7B is a sectional view corresponding to cutting plane line B of FIG. 7A.

The liner spacer layer 160 of the embodiment can also cover part of surface 103 of the substrate 100, and the top surfaces of the conductive strips 111 and the peripheral structures 112 are also covered by the liner spacer layer 160. Moreover, the liner spacer layer 160 can extend from the surface 103 of the substrate 100 to the conductive strips 111 and the peripheral structures 112, and top surfaces and sidewalls of the conductive strips 111 and the peripheral structures 112 are all covered by the liner spacer layer 160, which provide a protection and structural support. For example, material of the liner spacer layer 160 may include silicon oxide ($SiO_2$). In other embodiment of the present disclosure, material of the liner spacer layer 160 may include silicon nitride.

FIGS. 8A to 15A are top views illustrating various stages of a patterning method of a lower hard mask layer and the etching of the target metal layer, and FIGS. 8B to 15B are sectional views corresponding to cutting plane line B of FIGS. 8A to 15A, respectively, and FIGS. 8C to 15C are sectional views corresponding to cutting plane line C of FIGS. 8A to 15A, respectively.

Figure 8A:
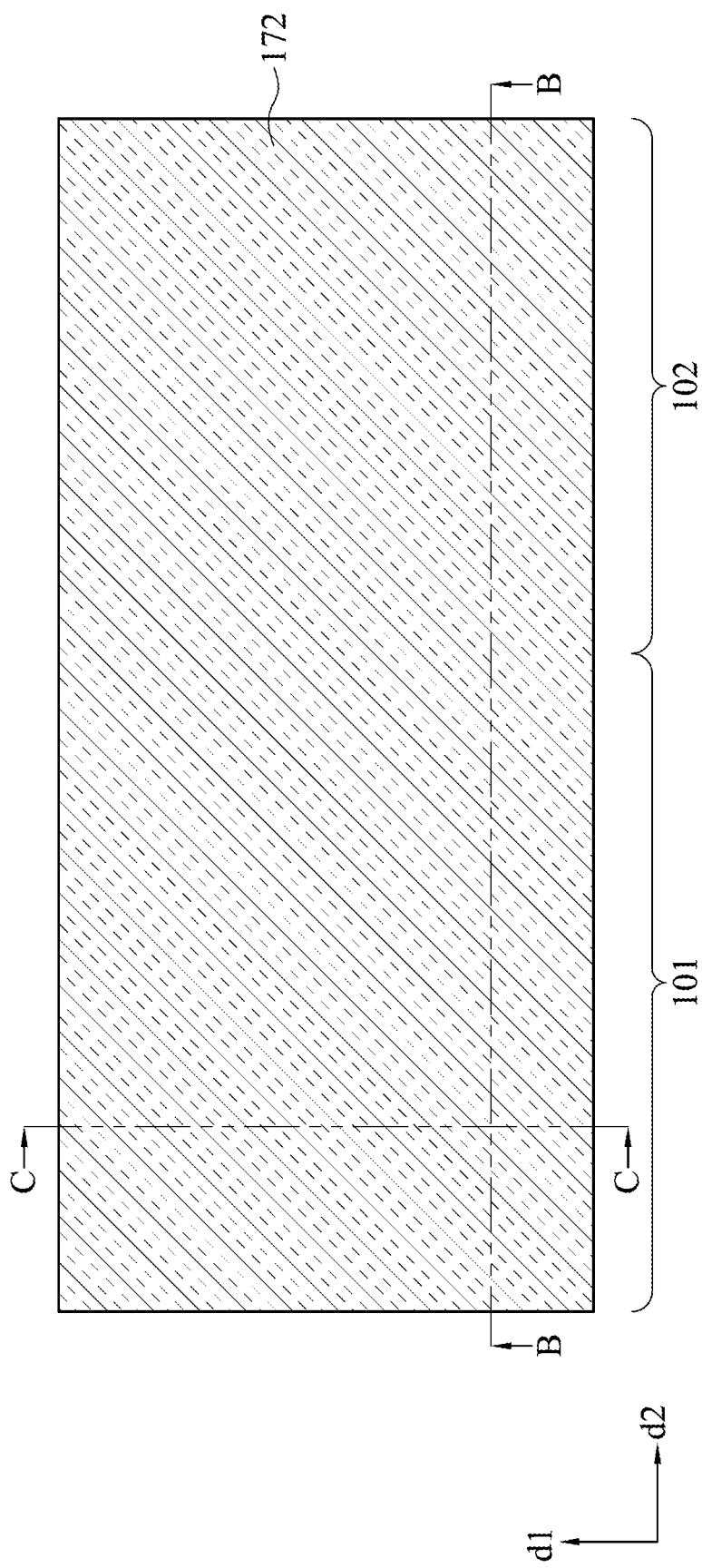
Figure 8B:
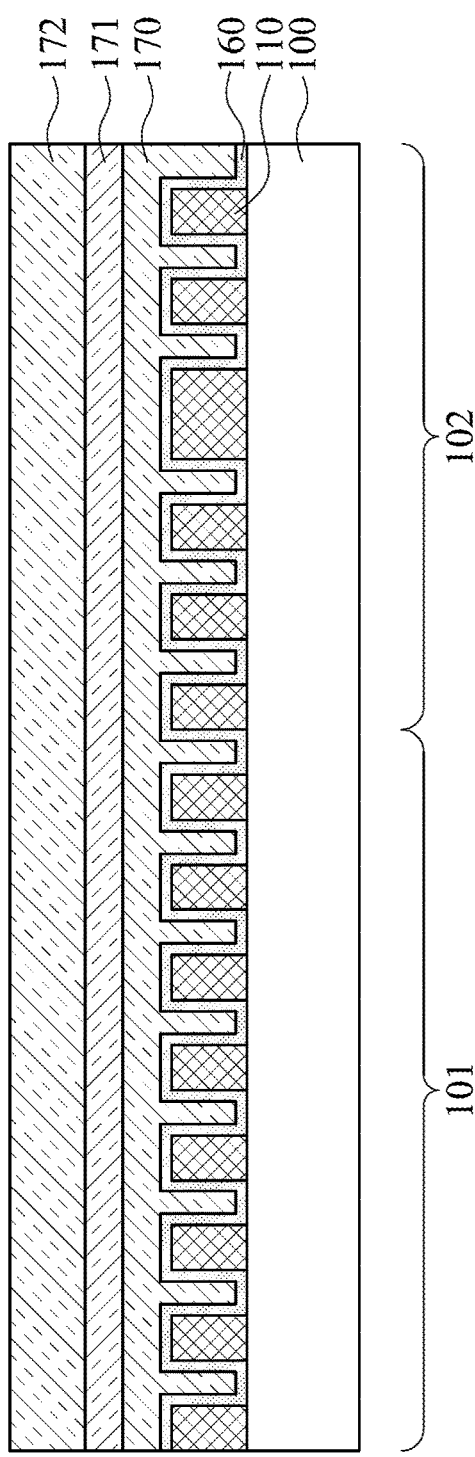
Figure 8C:
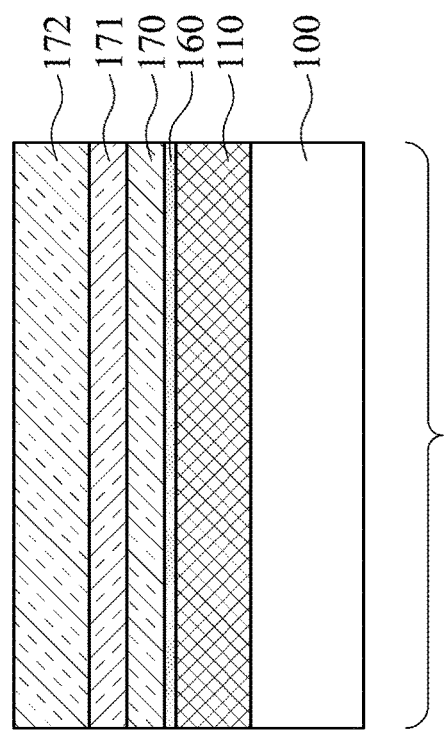

Referring to FIGS. 8A, 8B and 8C, in the embodiment, a lower organic hard mask layer 170, a lower hard mask layer 171, and an upper organic hard mask layer 172 are sequentially disposed on the conductive strips 110 covered with the liner spacer layer 160 and the peripheral structures 112 covered with the liner spacer layer 160.

Material of the lower organic hard mask layer 170 and material of the upper organic hard mask layer 172 are the same. The lower organic hard mask layer 170 of the embodiment fills the area between the liner spacer layer 160, and a CMP process may be perform on the lower organic hard mask layer 170 after the deposition thereof. Therefore, the lower organic hard mask layer 170 has a smooth flat surface for the deposition of the lower hard mask layer 171 thereon. The upper organic hard mask layer 172 is further disposed on the lower hard mask layer 171.

Figure 9A:
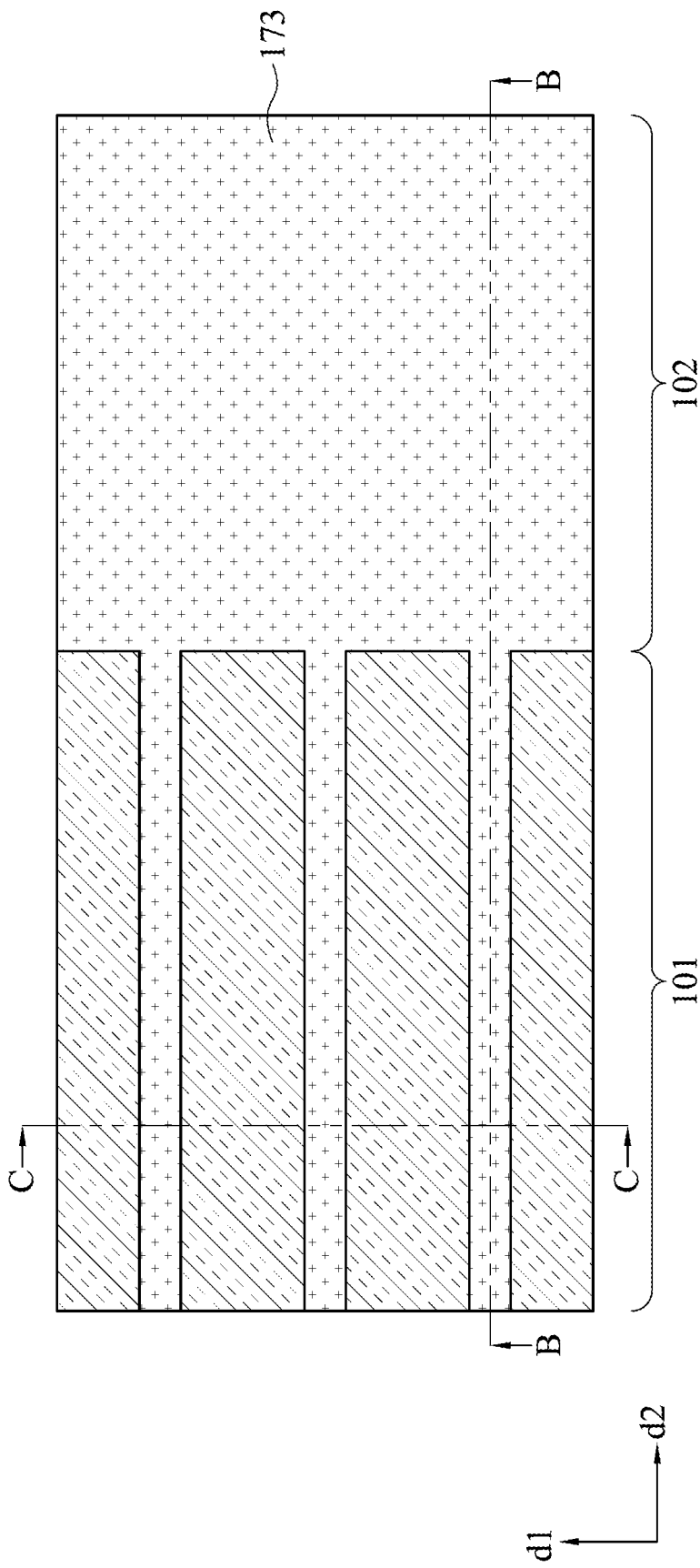
Figure 9B:
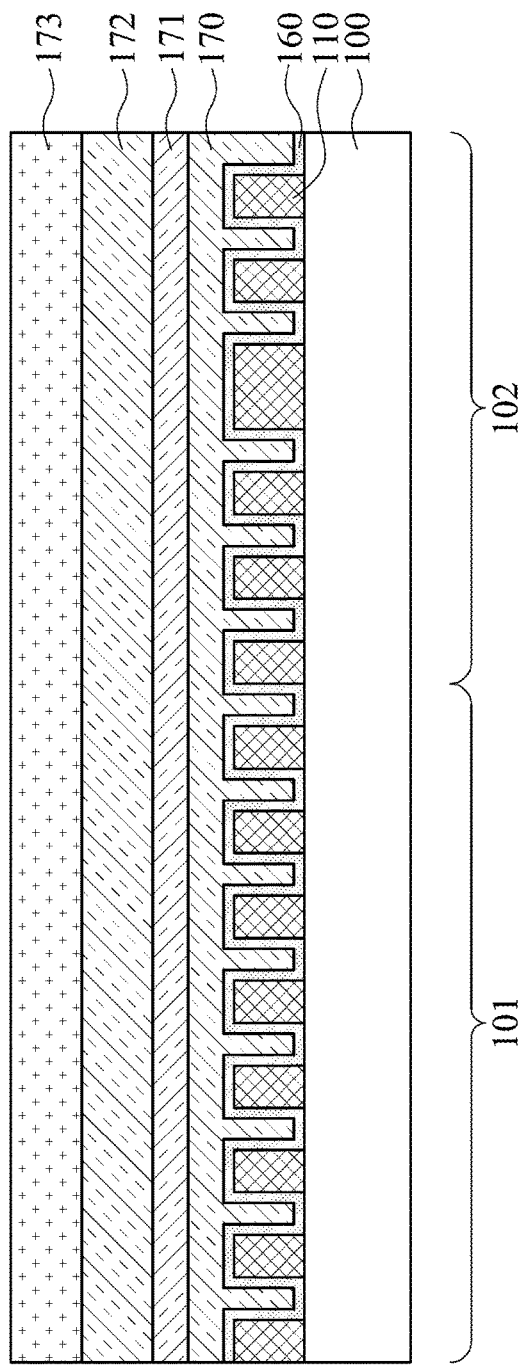
Figure 9C:
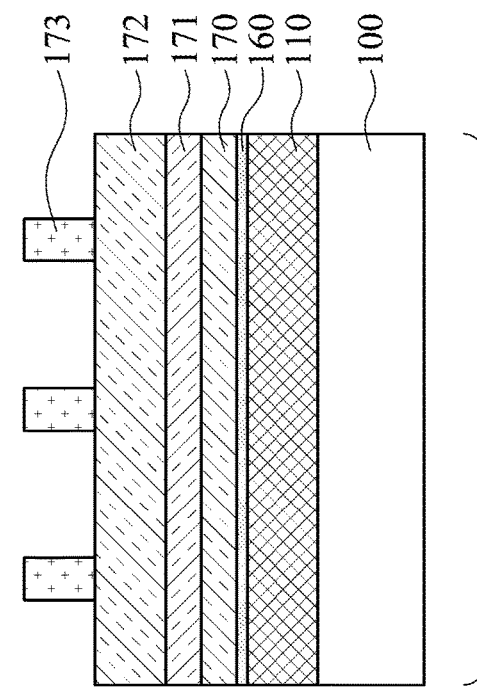

Referring to FIGS. 9A, 9B, and 9C, the method of the embodiment disposes a patterned photoresist layer 173 on the upper organic hard mask layer 172. In the array region 101, the photoresist layer 173 has patterns extending along the second direction d2, and the photoresist layer 173 covers the whole area in the peripheral region 102. In other words, only the photoresist layer 173 in the array region 101 is patterned.

Figure 10A:
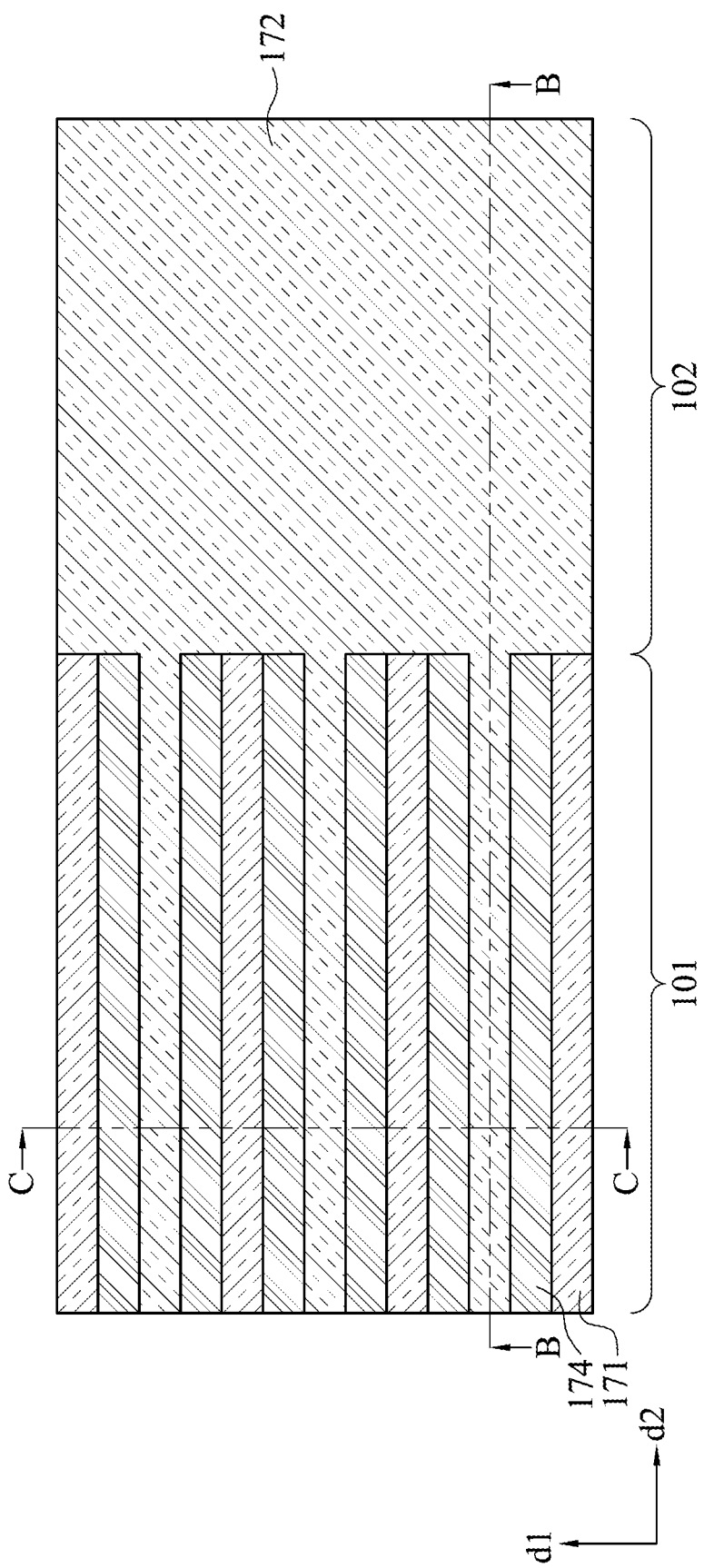
Figure 10B:
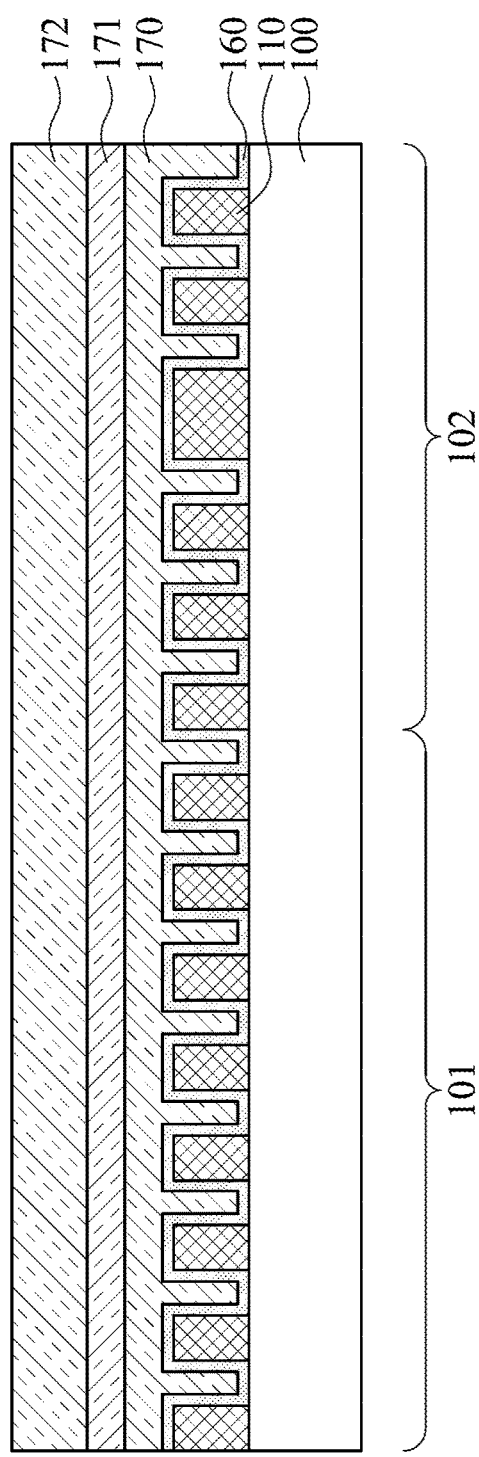
Figure 10C:
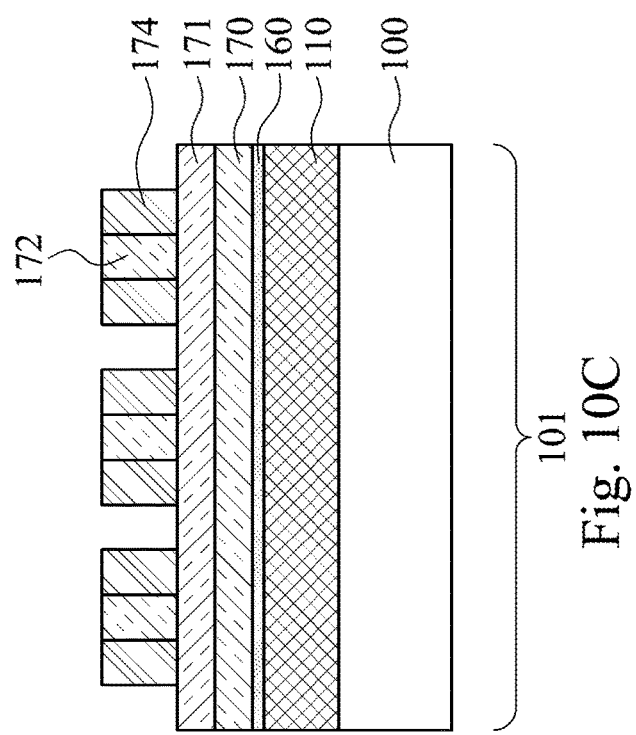

Referring to FIGS. 10A, 10B, and 10C, the method of the embodiment etches the upper organic hard mask layer 172 using the pattern of the photoresist layer 173 as a mask, and forms a plurality of second spacers 174 on sidewalls of the etched upper organic hard mask layer 172 in the array region 101.

Formation of the second spacers 174 is in a manner similar to the formation of the first spacers 142 described above, and therefore detail description will not be repeated here. Material of the second spacer 174 includes silicon oxide or silicon nitride.

Figure 11A:
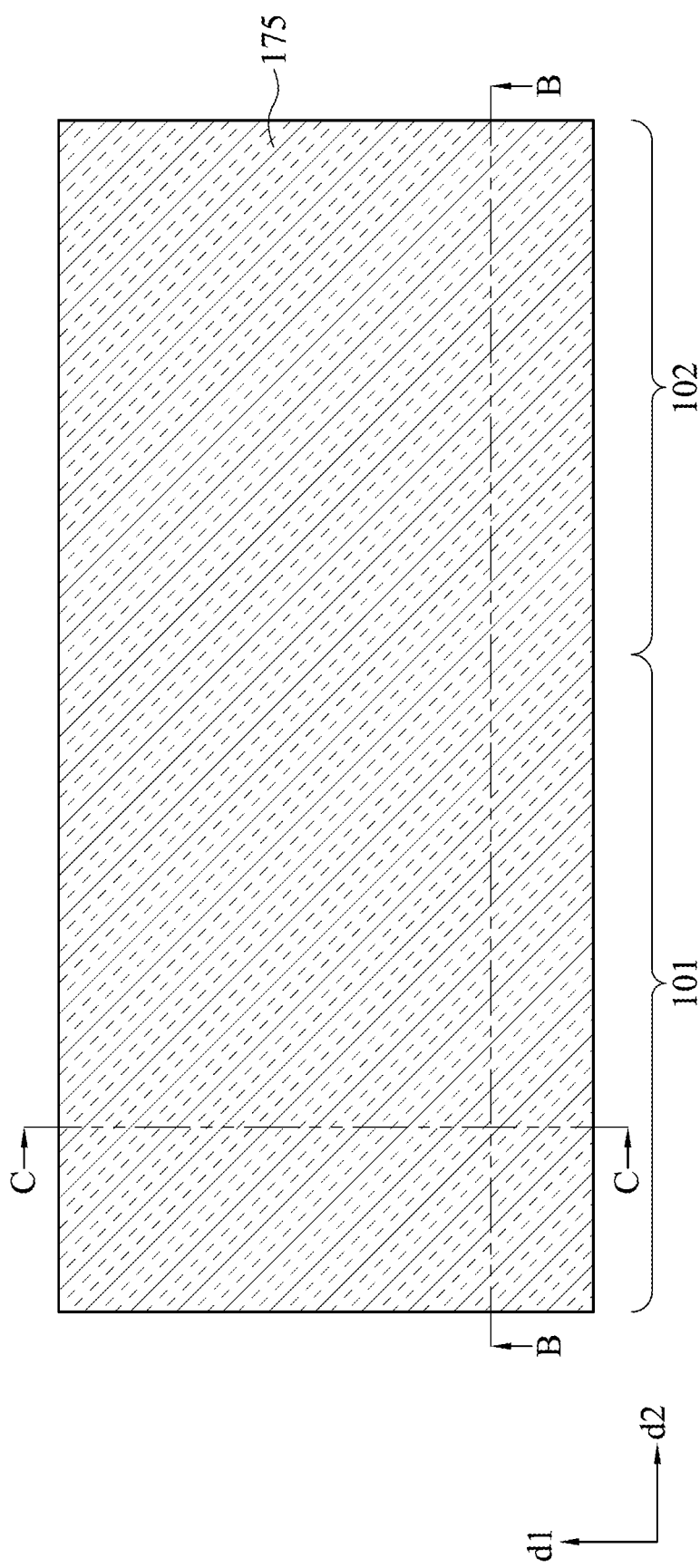
Figure 11B:
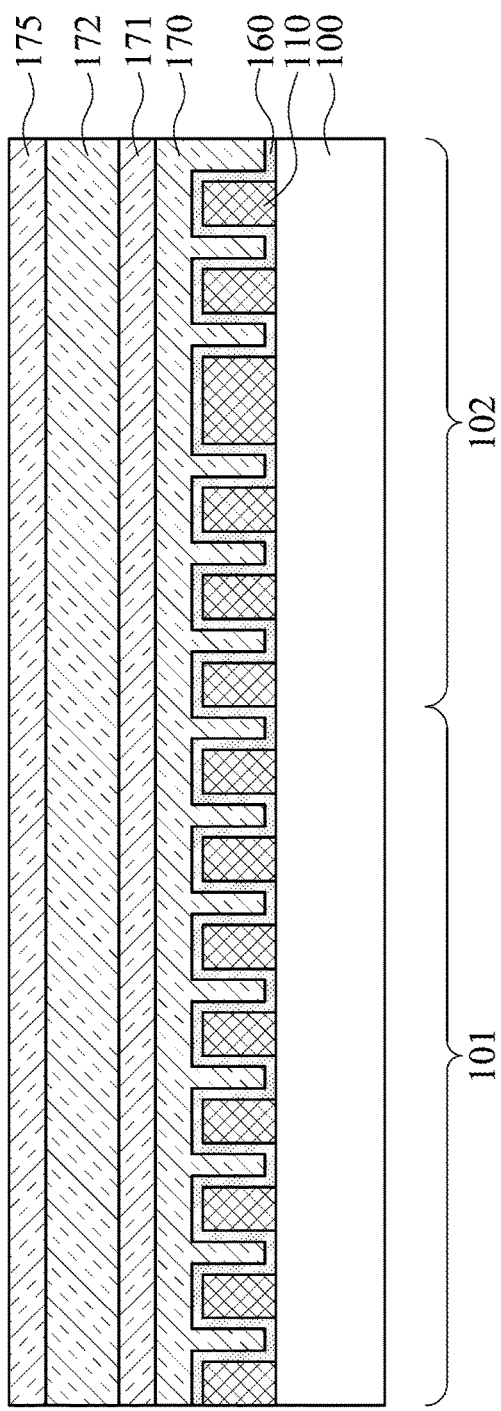
Figure 11C:
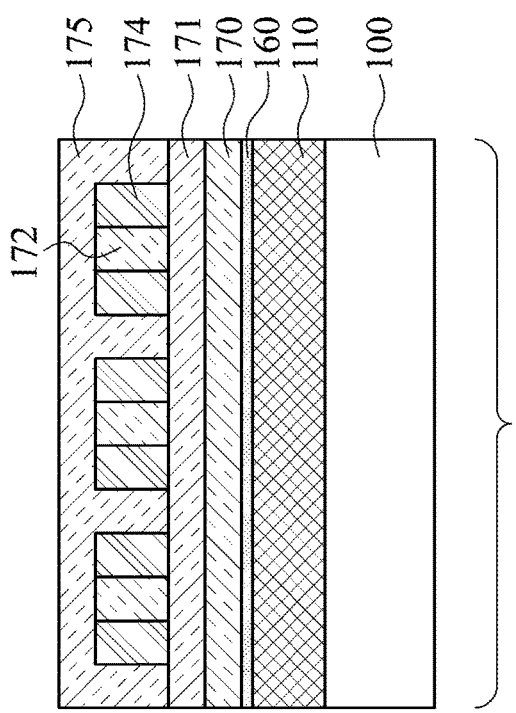

Referring to FIGS. 11A, 11B, and 11C, the method of the embodiment forms an organic layer 175 on the second spacers 174 and the upper organic hard mask layer 172, while the organic layer 175 fills the area between the second spacers 174 in the array region 101. Material of the organic layer 175 and material of the upper organic hard mask layer 172 are the same.

Figure 12A:
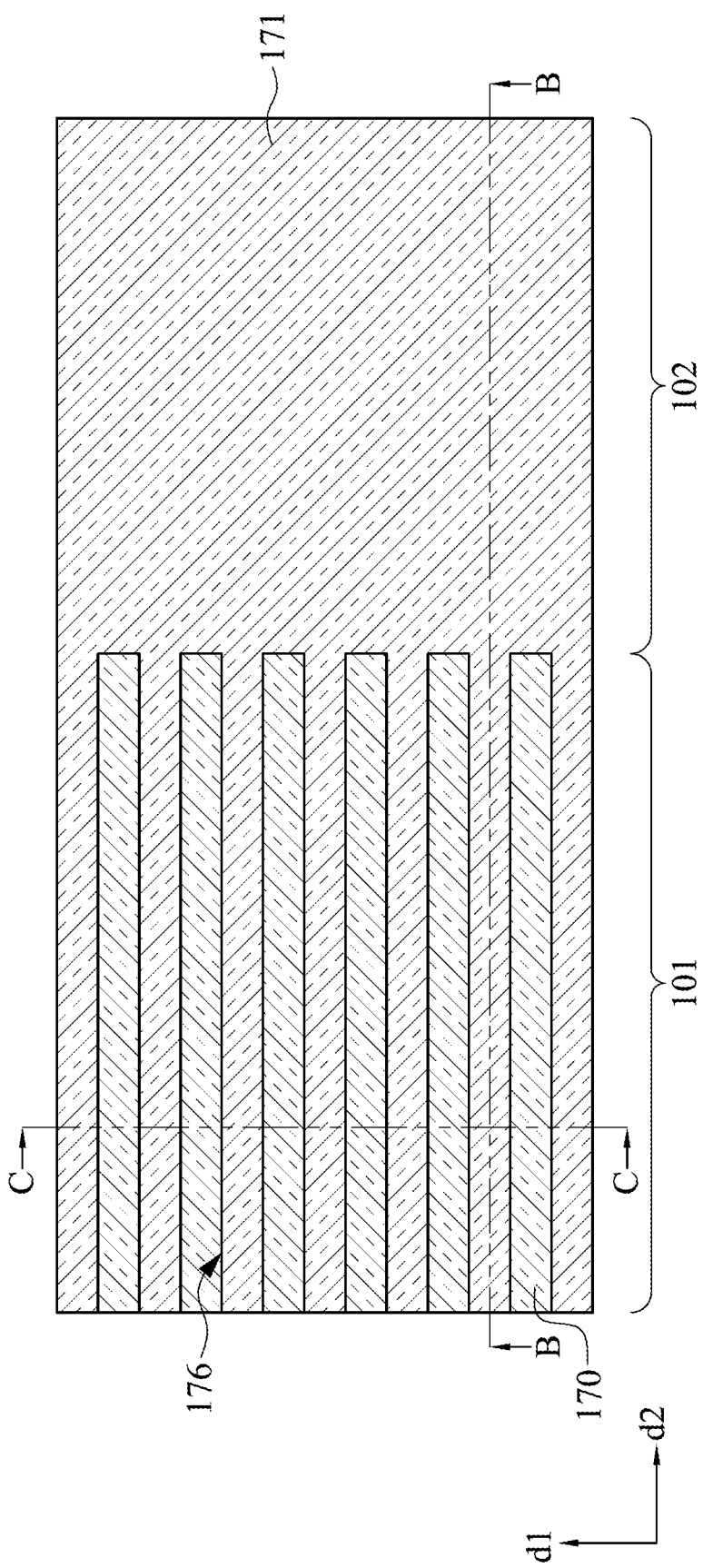
Figure 12B:
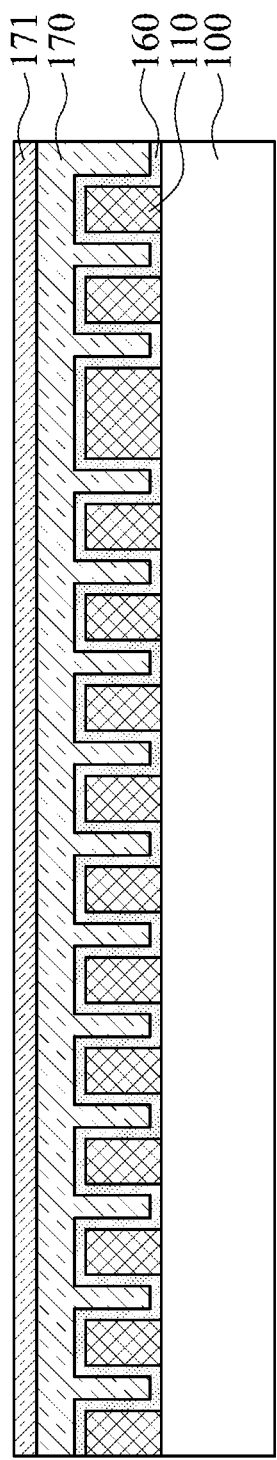
Figure 12C:
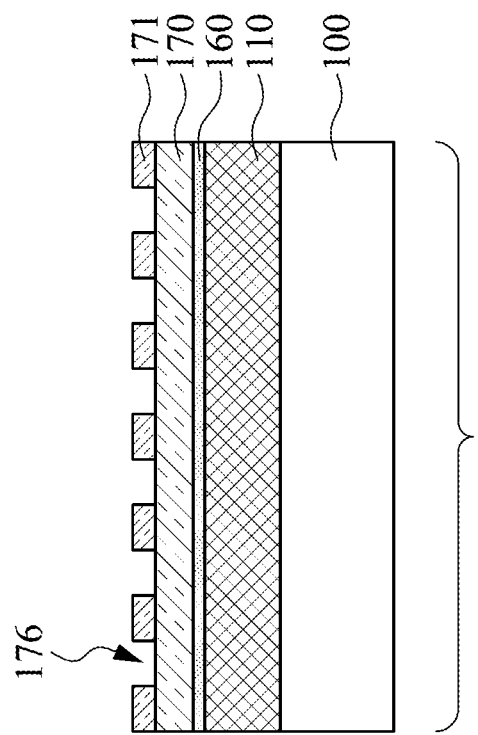

Referring to FIGS. 12A, 12B, and 12C, the method of the embodiment etches the lower hard mask layer 171 using the upper organic hard mask layer 172 and the organic layer 175 as mask.

For example, the organic layer 175 located above the level of top surface of the second spacers 174 is removed. Parts of the lower hard mask layer 171 in the array region, which was covered by the second spacers 174, are removed. Therefore, the hard mask layer 171 in the array region 101 defines a plurality of trenches 176 extending along the second direction d2.

Figure 13A:
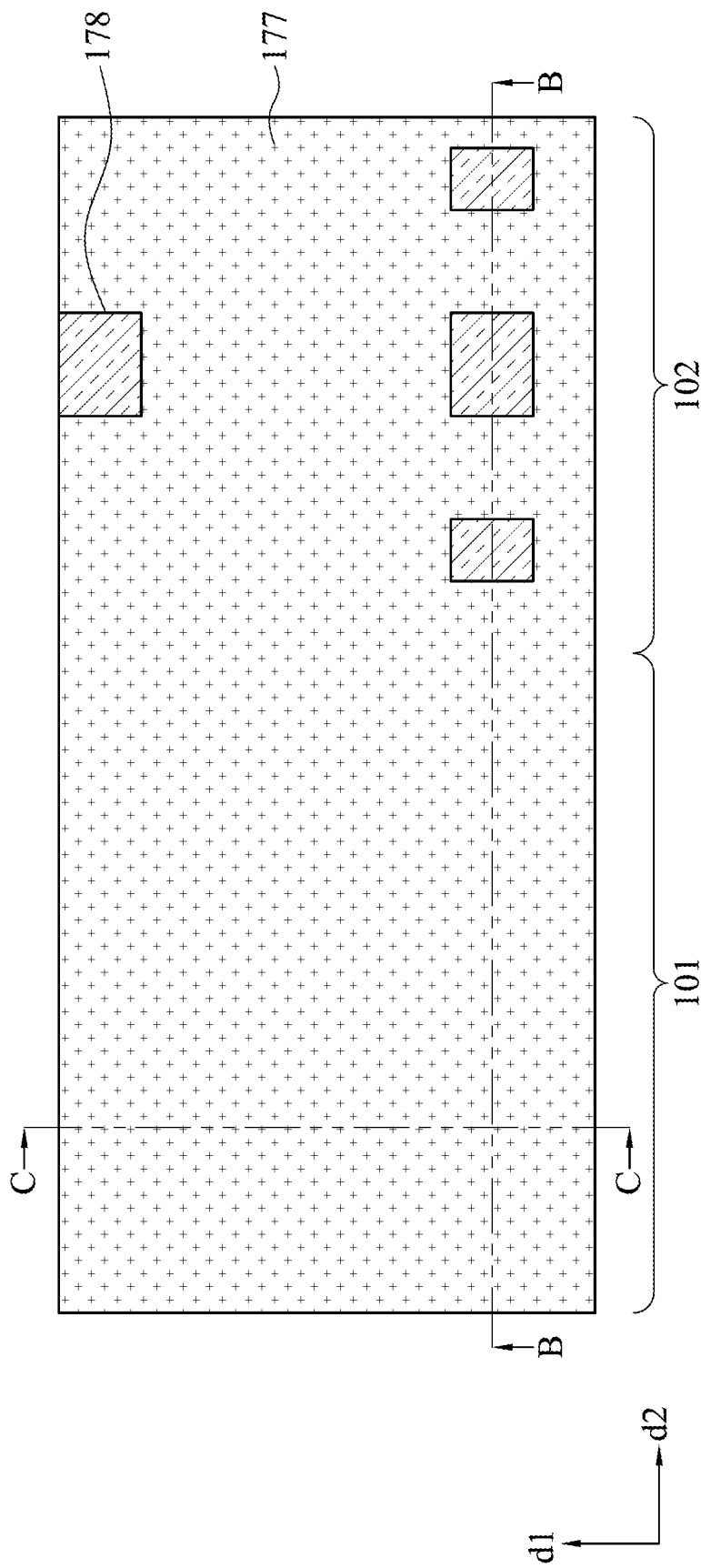

Referring to FIGS. 13A, 13B, and 13C, photoresist layer 177 is further disposed on the lower hard mask layer 171, and the photoresist layer 177 is patterned to have a plurality of holes 178 in the peripheral region 102.

For example, in some embodiments of the present disclosure, positions of the holes 178 of the photoresist layer 177 are corresponded to at least part of the positions of the peripheral structures 112 in the peripheral region 102, and peripheral structures 112 being exposed by the holes 178 of the photoresist layer 177 can be cut.

Figure 14A:
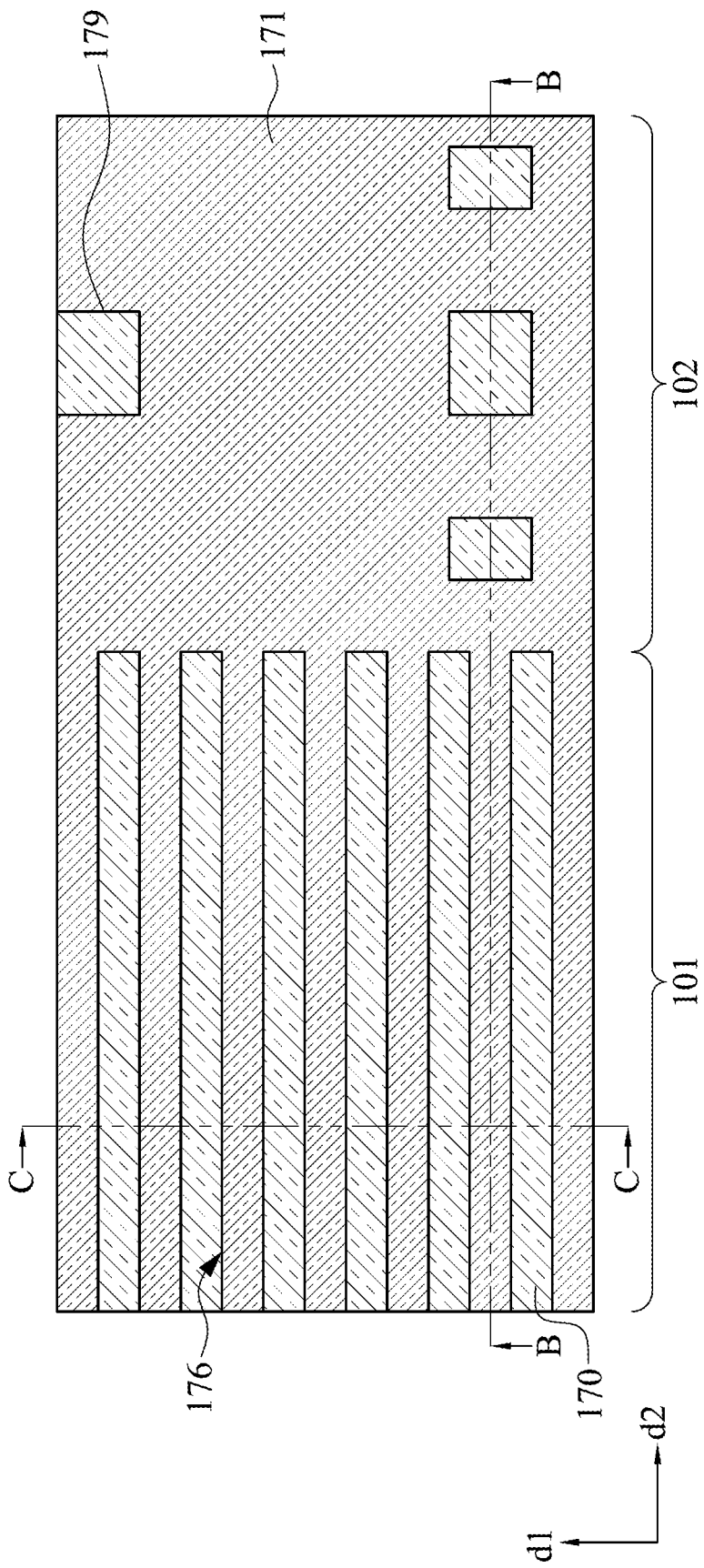

Referring to FIGS. 14A, 14B, and 14C, the lower hard mask layer 171 in the peripheral region 102 is etched using the photoresist layer 177. The etched lower hard mask layer 171 defines the trenches 176 and holes 179 on the conductive strips 111 and the peripheral structures 112 covered with the liner spacer layer 160. The trenches 176 extend along the second direction d2, and being located in the array region 101. The holes 179 are located in the peripheral region 102. The holes 179 expose parts of the lower organic hard mask layer 170 covering the peripheral structures 112.

Figure 15A:
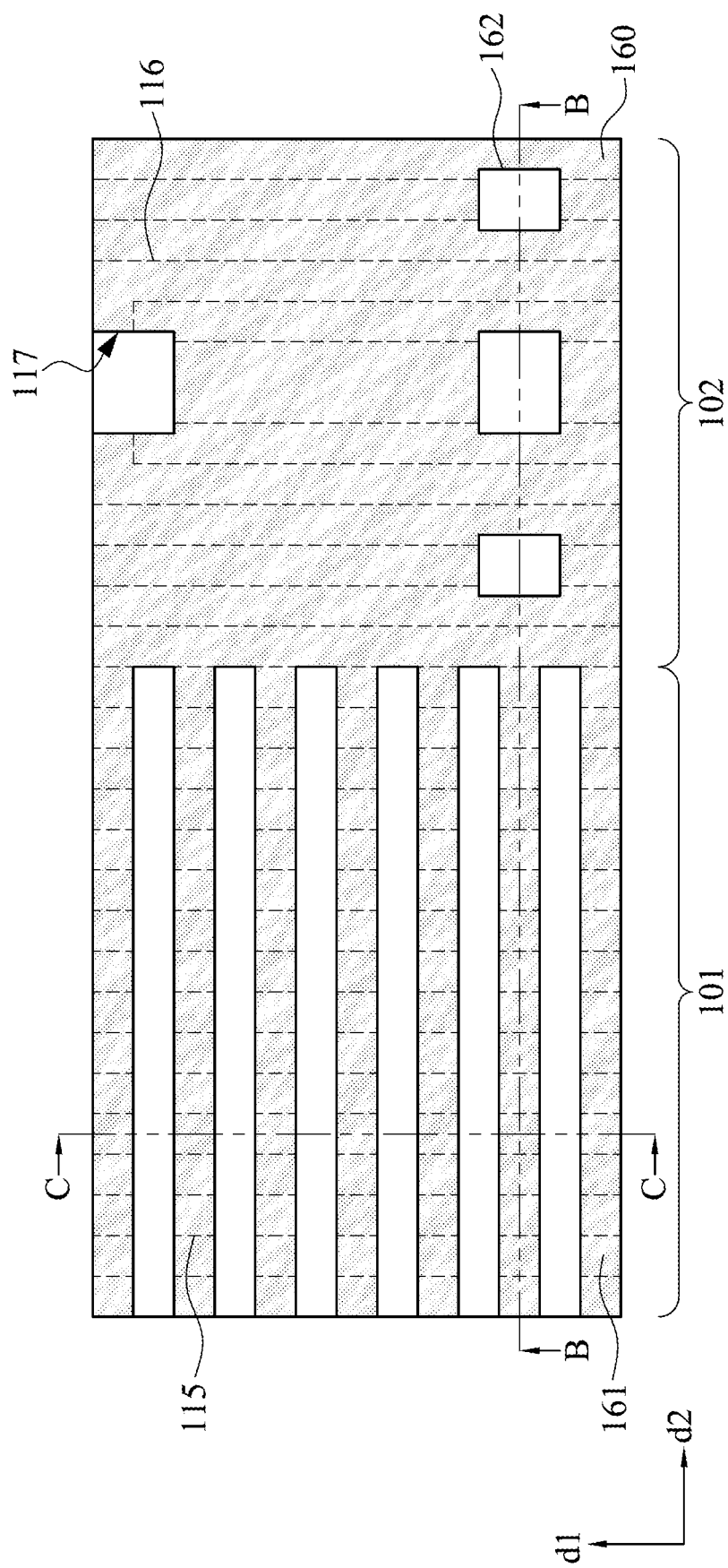

Referring to FIGS. 15A, 15B, and 15C, the conductive strips 111 and the peripheral structures 112 and the liner spacer layer 160 are etched using the lower hard mask layer 171 as a mask. The remaining portions of the conductive strips 111 and the peripheral structures 112 construct a conductive layer 113 over the substrate 100. The conductive layer 113 has a plurality of arrays 114 in the array region 101, and a plurality of conductive structures 116 in the peripheral region 102.

Referring to FIG. 15B, the array 114 of the embodiment includes a plurality of conductive pillars 115. Moreover, the conductive pillar 115 has second sidewalls 115a and 115b facing along the second direction d2, and a top surface 115c connecting the second sidewalls 115a and 115b. In each of the conductive pillars 115, the second sidewalls 115a and 115b are covered by the liner spacer layer 160. Moreover, the liner spacer layer 160 is extended from the surface 103 of the substrate 100 between the conductive pillars 115 in the array 114, and the liner spacer layer 160 on the conductive pillar 115 is connected to the liner spacer layer 160 on another conductive pillar in the array 114.

Referring to FIGS. 15A, 15B, and 15C, in other words, the liner spacer layer 160 forms a plurality of strips 161 extending along the second direction d2, and each of the arrays 114 is conformally covered by one of the strips 161. Also, in the first direction d1, width W2 of the conductive pillar 115 and width W1 of the strip 161 of the liner spacer layer 160 in the array region 101 are the same.

Referring to FIG. 15C, the conductive pillar 115 has first sidewalls 115d, 115e facing along the first direction d1. The first sidewalls 115d, 115e of the conductive pillar 115 are exposed by the liner spacer layer 160. In other words, the liner spacer layer 160 of the embodiment covers only the top surface 115c, and the second sidewalls 115a, 115b, and the first sidewalls 115d, 115e are free from the liner spacer layer 160.

For example, the conductive pillars 115 of the embodiment may be the conduction pads between a metal-oxide semiconductor transistor and a capacitor, while the liner spacer layer 160 can provide a proper protection and structural support.

In the peripheral region 102 of the embodiment, each of the conductive structures 116 has at least one conductive sidewall 117, which is free from the liner spacer layer 160, and the rest sidewalls of the conductive structures 116 are covered with the liner spacer layer 160. Moreover, the liner spacer layer 160 in the peripheral region has a plurality of openings 162, and the rest of the peripheral region 102 is covered with the liner spacer layer 160, and locations of the connecting sidewalls 117 of the conductive structures 116 are corresponded to locations of the openings 162 of the liner spacer layer 160.

For example, in the semiconductor device of the embodiment, the conductive structures 116 can be peripheral circuits of the arrays 114, and the liner spacer layer 160 thereon is further extended to the surface 103 of the substrate 100, providing a fully sealed structure at most of the conductive structures 116. Therefore, the liner spacer layer 160 of the embodiment can provide a proper protection and structural support to both the arrays 114 and the conductive structures 116.

The first direction d1 and the second direction d2 of the above embodiment are perpendicular to each other, but the disclosure is not limit thereto. In some embodiments of the present disclosure, there can be different angles between the first direction d1 and second direction d2.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device, comprising:
a substrate having an array region and a peripheral region;
a plurality of arrays disposed on the array region, wherein each of the arrays has a plurality of conductive pillars;
a plurality of conductive structures disposed on the peripheral region, wherein each of the conductive structures has at least one connecting sidewall; and
a liner spacer layer covering top surfaces of the conductive pillars of the arrays and top surfaces of the conductive structures,
wherein a plurality of first sidewalls of the conductive pillars facing along a first direction and the connecting sidewall of the conductive structure are free from the liner spacer layer, and the conductive pillars are arranged along a second direction in each of the arrays, and the second direction is different from the first direction, and the liner spacer layer on the conductive pillars and the conductive structures are extended from the substrate.

2. The semiconductor device of claim 1, wherein material of the liner spacer layer includes silicon oxide or silicon nitride.

3. The semiconductor device of claim 1, wherein each of the conductive pillars includes a plurality of second sidewalls facing along the second direction and a top surface, and the top surfaces and the second sidewalls facing along the second direction of the conductive pillars are covered with the liner spacer layer.

4. The semiconductor device of claim 1, wherein, in each of the arrays, the liner spacer layer on one of the conductive pillars is connected to the liner spacer layer on another conductive pillar.

5. The semiconductor device of claim 1, wherein the liner spacer layer includes a plurality of openings in the peripheral region, and rest of the peripheral region is covered with the liner spacer layer, and locations of the connecting sidewall of each of the conductive structures are corresponded to locations of one of the openings of the liner spacer layer.

6. The semiconductor device of claim 1, wherein the liner spacer layer includes a plurality of strips, and the arrays are respectively covered by the strips.

7. The semiconductor device of claim 6, wherein width of each of the strips and width of each of the conductive pillars on the first direction are substantially the same.

8. A method for manufacturing a semiconductor device, comprising following operations:
patterning a target metal layer on an array region and a peripheral region of a substrate, wherein the patterned target metal layer includes a plurality of conductive strips located at the array region and a plurality of peripheral structures located at the peripheral region;
disposing a liner spacer layer on the conductive strips and the peripheral structures;
disposing a lower hard mask layer on the liner spacer layer;
etching the lower hard mask layer on the array region;
etching the lower hard mask layer on the peripheral region; and
etching the conductive strips and the peripheral structures into a plurality of arrays and a plurality of conductive structures respectively by using the lower hard mask layer, wherein the conductive strips extend along a first direction, and the etched lower hard mask layer defines a plurality of trenches extending along a second direction in the array region, which is different from the first direction, and the etched lower hard mask layer has a plurality of holes on the peripheral region, and etching of the peripheral structures cuts the peripheral structures into the conductive structures.

9. The method of claim 8, wherein the liner spacer layer is disposed on the conductive strips and the peripheral structures through atomic layer deposition, and the liner spacer layer extends from the substrate to tops of the conductive strips and the peripheral structures.

10. The method of claim 8, further comprising:
disposing a lower organic hard mask layer on the liner spacer layer after the liner spacer layer is disposed on the conductive strips and the peripheral structures, wherein the lower organic hard mask layer fills a plurality of gap between the liner spacer layer.

* * * * *